US012690265B2

(12) United States Patent
Fu et al.

(10) Patent No.: US 12,690,265 B2
(45) Date of Patent: Jul. 21, 2026

(54) FIELD EFFECT TRANSISTOR WITH ISOLATION STRUCTURE AND RELATED METHOD

(71) Applicant: Taiwan Semiconductor Manufacturing Co., Ltd., Hsinchu (TW)

(72) Inventors: Shih-Chi Fu, Hsinchu (TW); Chih-Hsiung Peng, Hsinchu (TW); Kuei-Shun Chen, Hsinchu (TW); Te-Yu Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 407 days.

(21) Appl. No.: 18/498,334

(22) Filed: Oct. 31, 2023

(65) Prior Publication Data

US 2024/0395813 A1 Nov. 28, 2024

Related U.S. Application Data

(60) Provisional application No. 63/504,578, filed on May 26, 2023.

(51) Int. Cl.
*H10D 84/85* (2025.01)
*H10D 30/01* (2025.01)
(Continued)

(52) U.S. Cl.
CPC ........... *H10D 84/85* (2025.01); *H10D 30/014* (2025.01); *H10D 30/43* (2025.01);
(Continued)

(58) Field of Classification Search
CPC ...... H10D 84/85; H10D 30/014; H10D 30/43; H10D 30/6735; H10D 62/121;
(Continued)

(56) References Cited

U.S. PATENT DOCUMENTS

2017/0256612 A1* 9/2017 Guillorn .............. H10D 62/121
2019/0165118 A1* 5/2019 Leobandung ........ H10D 30/014
(Continued)

FOREIGN PATENT DOCUMENTS

CN 103165415 B 5/2016
KR 1020210024405 A 3/2021
(Continued)

*Primary Examiner* — S M Sohel Imtiaz
(74) *Attorney, Agent, or Firm* — Seed IP Law Group

(57) ABSTRACT

A method includes: forming a first stack of semiconductor channels and a second stack of semiconductor channels over a substrate, the first stack being adjacent the second stack, a transition region overlapping neighboring protruding corners of the first stack and the second stack; forming a plurality of sacrificial gates over the first stack and the second stack, the plurality of sacrificial gates extending in a first direction and being arranged along a second direction transverse the first direction based on a first pitch along a second direction, each of the plurality of sacrificial gates having a first width; simultaneously with the forming a plurality of sacrificial gates, forming a bar structure over the transition region and adjacent to the plurality of sacrificial gates, the bar structure having a second width that exceeds a sum of the first pitch and the first width; forming a plurality of source/drain openings in areas of the first and second stacks of semiconductor channels that are exposed by the plurality of sacrificial gates and the bar structure; forming a plurality of source/drain regions in the plurality of source/drain openings; replacing the plurality of sacrificial gates with a plurality of gate structures that wrap around the semiconductor channels of the first and second stacks; simultaneously with replacing the plurality of sacrificial gates, replacing the bar structure with an inactive gate structure; and replacing the inactive gate structure with an isolation structure.

20 Claims, 32 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 64/01* | (2025.01) |
| *H10D 84/01* | (2025.01) |
| *H10D 84/03* | (2025.01) |

(52) U.S. Cl.
CPC ....... *H10D 30/6735* (2025.01); *H10D 62/121* (2025.01); *H10D 64/017* (2025.01); *H10D 84/0167* (2025.01); *H10D 84/017* (2025.01); *H10D 84/0188* (2025.01); *H10D 84/038* (2025.01)

(58) Field of Classification Search
CPC ............. H10D 64/017; H10D 84/0167; H10D 84/017; H10D 84/0188; H10D 84/038
See application file for complete search history.

(56) References Cited

U.S. PATENT DOCUMENTS

| | | | | |
|---|---|---|---|---|
| 2020/0118892 | A1* | 4/2020 | Cheng | H10D 30/6758 |
| 2021/0134677 | A1* | 5/2021 | Pan | H10D 84/013 |
| 2021/0305401 | A1* | 9/2021 | Liaw | H10D 30/014 |
| 2021/0408022 | A1* | 12/2021 | Young | H10D 30/6735 |
| 2022/0093612 | A1* | 3/2022 | Liaw | H10D 30/6735 |
| 2022/0093767 | A1* | 3/2022 | Liaw | H10D 62/116 |
| 2022/0359677 | A1* | 11/2022 | Jao | H10D 30/6729 |

FOREIGN PATENT DOCUMENTS

| | | | |
|---|---|---|---|
| KR | 20210086459 | A | 7/2021 |
| KR | 1020210086459 | A | 7/2021 |
| KR | 1020210149594 | A | 12/2021 |
| KR | 20220022576 | A | 2/2022 |

* cited by examiner

FIELD EFFECT TRANSISTOR WITH ISOLATION STRUCTURE AND RELATED METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-13 are views of various embodiments of an IC device of at various stages of fabrication according to various aspects of the present disclosure.

DETAILED DESCRIPTION

Figures 1A, 1B:
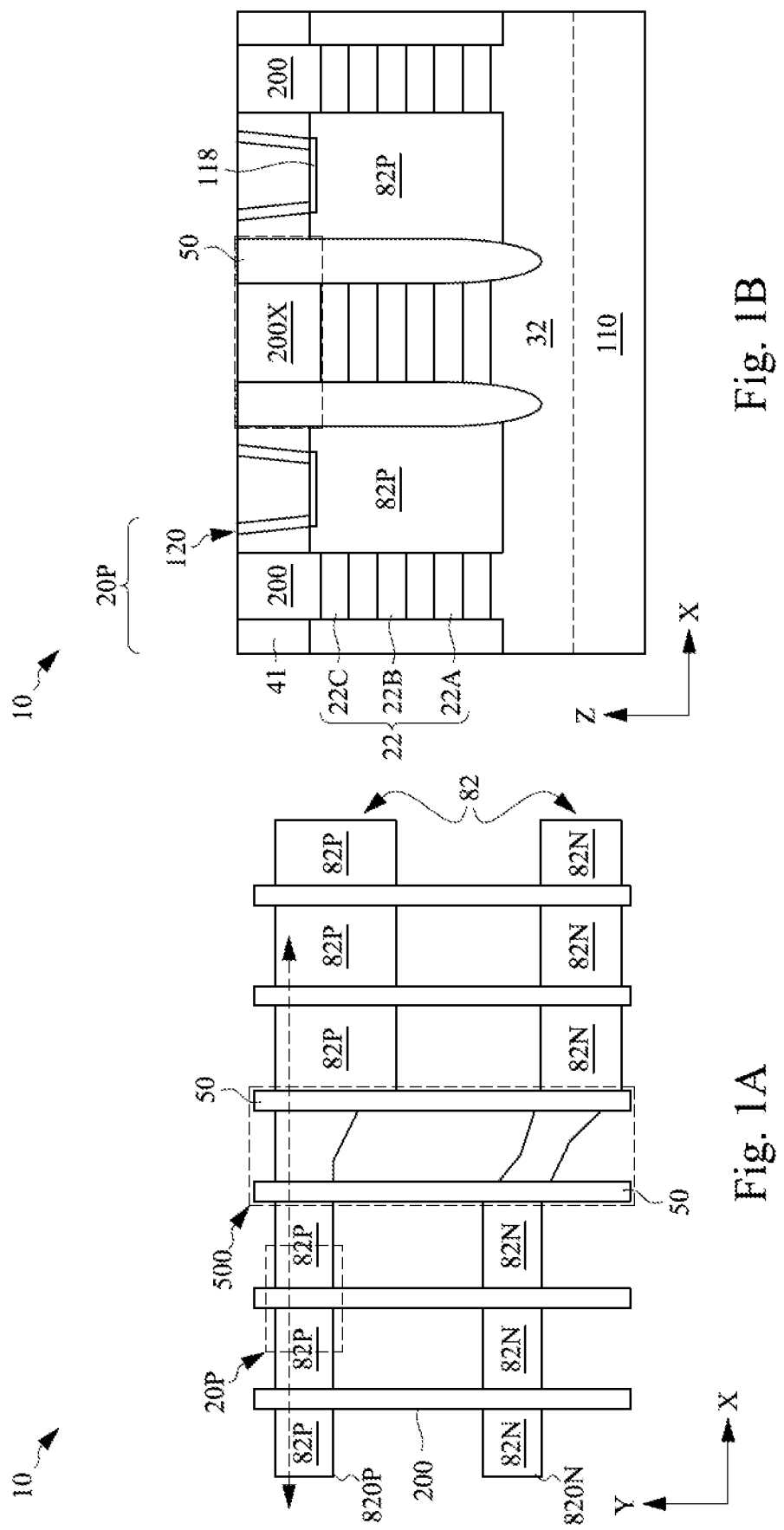
FIGS. 1A-1E are diagrammatic plan and cross-sectional side views of a portion of an IC device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as "about," "substantially," and the like, should be interpreted as one having ordinary skill in the art would in view of current technological norms.

The terms "first," "second," "third" and so on may be used herein to describe a sequence of events or sequential order of elements but may be exchanged or varied in some contexts. For example, a second layer may be formed on (e.g., sequentially after) a first layer, but in some contexts the first layer may be referred to as a "second layer," "third layer," "fourth layer" or the like, and the second layer may be referred to as a "first layer," "third layer," "fourth layer," or the like.

The term "surrounds" may be used herein to describe a structure that fully or partially encloses another element or structure, for example, in three dimensions. For example, a first structure may "surround" a second structure on four lateral sides (e.g., left, right, front and back) without surrounding the second structure on two vertical sides (e.g., top and bottom). In other example, the first structure may wrap partially around the second structure, for example, by wrapping around three sides (e.g., top, front and back) while leaving other sides (e.g., left, right and bottom) exposed.

The present disclosure is generally related to semiconductor devices, and more particularly to field-effect transistors (FETs), such as planar FETs, three-dimensional fin FETs (FinFETs), or nanostructure FETs, such as nanosheet FETs (NSFETs), nanowire FETs (NWFETs), gate-all-around FETs (GAAFETs) and the like.

Spacing and/or pitch scaling is increasingly difficult in advanced process nodes. In semiconductor fabrication, "jog" refers to a layout design technique that can improve performance and reliability of integrated circuits (ICs). Jog involves intentionally adding selected deviations or variations in placement of features or circuit elements to avoid undesirable effects caused by strict regularity in a layout. Jogs may be associated with a variety of benefits. For example, jogs may reduce electromigration, reduce distortion of patterns due to optical proximity effects during the lithography process and improve alignment and registration between different layers. L-shaped oxide diffusion (OD), C-shaped OD and other types of jog OD rounding are still insufficiently covered by epitaxial region (EPI) jog rounding at N/P boundaries. For advanced nodes, EPI rounding to OD has reduced process margin that may increase EPI defect noise.

Embodiments of the disclosure provide a process which forms a bar structure or "polysilicon bar" (POBAR) pattern that covers OD and/or EPI rounding locations to reduce EPI defect noise. Including the POBAR pattern to cover OD patterns masks the underlying structure during an epitaxial growth process. Thus, EPI defects can be reduced or eliminated.

In the embodiments, POBAR has width that may be n times poly (PO) pitch+1*PO width. The POBAR may be positioned above an N/P boundary that has OD/EPI rounding jog. Edges of the POBAR may be located at two times normal PO edge. Length of the POBAR is not particularly limited. Multiple POBARs may abut each other.

Nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure structure.

FIGS. 1A, 1B, 1C, 1D, 1E illustrate diagrammatic plan and cross-sectional side views of a portion of nanostructure devices 10, 10A in accordance with various embodiments. FIG. 1A illustrates a view in an X-Y plane, in which isolation structures 50 are positioned at edges of jog regions 500 (highlighted by a dashed rectangle in FIG. 1A). The dashed rectangle may also refer to position of a POBAR that is not present in the nanostructure devices 10, 10A, but is used in one or more operations performed to fabricate the nanostructure devices 10, 10A. The nanostructure devices 10, 10A of FIGS. 1A-1E are described in detail below to provide context for understanding the technical features and benefits of the various embodiments depicted in FIGS. 2A-13.

Referring to FIGS. 1A and 1B, nanostructure device 20P may be or include one or more N-type FETs (NFETs) or P-type FETs (PFETs), but is depicted for illustration purposes as a PFET, and may be referred to as the PFET 20P. The nanostructure device 20P is formed over and/or in a substrate 110, and generally includes a gate structure 200 that straddles and/or wraps around semiconductor channels or nanostructures 22A, 22B, 22C, collectively referred to as channels or nanostructures 22, located over semiconductor fins 32 protruding from, and separated by, isolation structures 36 (see FIG. 3B). The gate structure 200 controls electrical current flow through the channels 22A, 22B, 22C.

The nanostructure device 20P is shown including three channels 22A, 22B, 22C, which are laterally abutted by source/drain features or regions 82P and covered and surrounded by the gate structure 200. Generally, the number of channels 22 is two or more, such as three or four or more. The gate structure 200 controls flow of electrical current through the channels 22A, 22B, 22C to and from the source/drain features 82P based on voltages applied at the gate structure 200 and at the source/drain features 82P. Other nanostructure devices that are not specifically labeled in FIG. 1A may be NFETs and include source/drain features or regions 82N. The source/drain regions 82P, 82N may be referred to as source/drain regions 82 for simplicity of description throughout.

The source/drain regions 82P may be positioned in P-type OD regions 820P. The source/drain regions 82N may be positioned in N-type OD regions 820N. Portions of the OD regions 820P, 820N that are overlapped by a bar structure or POBAR 500 may be jog regions. The jog regions may be regions that are between electronic circuits, such as between a first memory circuit and a second memory circuit or between a first logic circuit and a second logic circuit. Generally, epitaxial features formed in the jog regions are not intended to be active. In embodiments of the disclosure, no epitaxial feature is formed in the jog regions due to presence of the POBAR 500. In subsequent operations, the POBAR 500 may be removed, and the isolation regions 50 may be formed on either side of an inactive gate structure 200X depicted in FIG. 1B. This can be beneficial to prevent or reduce EPI defect noise errors.

Figures 1C, 1D:
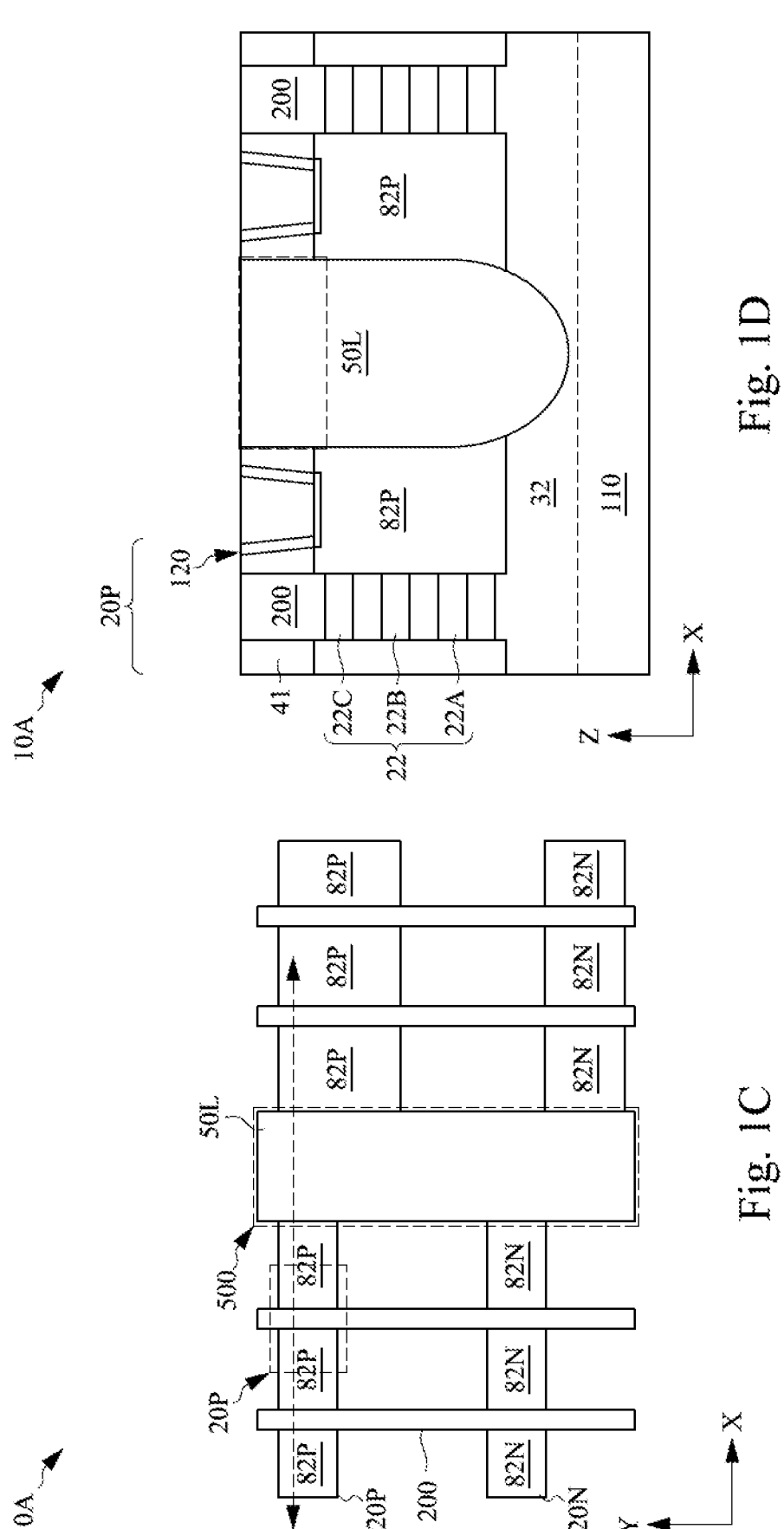

In some embodiments, as depicted in FIGS. 1C and 1D, a large isolation region 50L may be formed that extends from one source/drain region 82P to another source/drain region 82P. The large isolation region 50L may extend from one poly gate to another directly adjacent poly gate, inclusive. This is described in greater detail with reference to FIGS. 2A-13 below.

In some embodiments, the fin structure 32 includes silicon. In some embodiments, the nanostructure device includes an NFET, and the source/drain features 82N thereof include silicon phosphorous (SiP), SiAs, SiSb, SiPAs, SiP: As:Sb, combinations thereof, or the like. In some embodiments, the nanostructure device 20P include a PFET, and the source/drain features 82P thereof include silicon germanium (SiGe), either undoped or doped to form, for example, SiGe:B, SiGe:B:Ga, SiGe:Sn, SiGe:B:Sn, or another appropriate semiconductor material. Generally, the source/drain features 82 may include any combination of appropriate semiconductor material(s) and appropriate dopant(s).

The channels 22A, 22B, 22C each include a semiconductive material, for example silicon or a silicon compound, such as silicon germanium, or the like. The channels 22A, 22B, 22C are nanostructures (e.g., having sizes that are in a range of a few nanometers) and may also each have an elongated shape and extend in the X-direction. In some embodiments, the channels 22A, 22B, 22C each have a nanowire (NW) shape, a nanosheet (NS) shape, a nanotube (NT) shape, or other suitable nanoscale shape. The cross-sectional profile of the channels 22A, 22B, 22C may be rectangular, round, square, circular, elliptical, hexagonal, or combinations thereof.

Figure 3B:
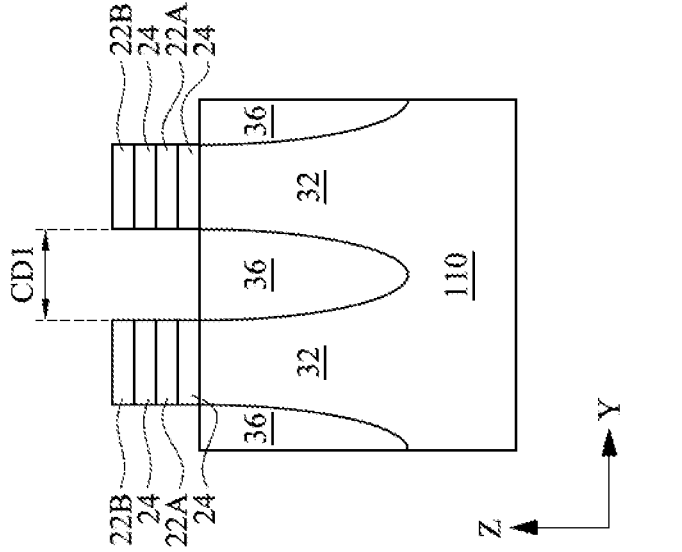
Figure 3A:
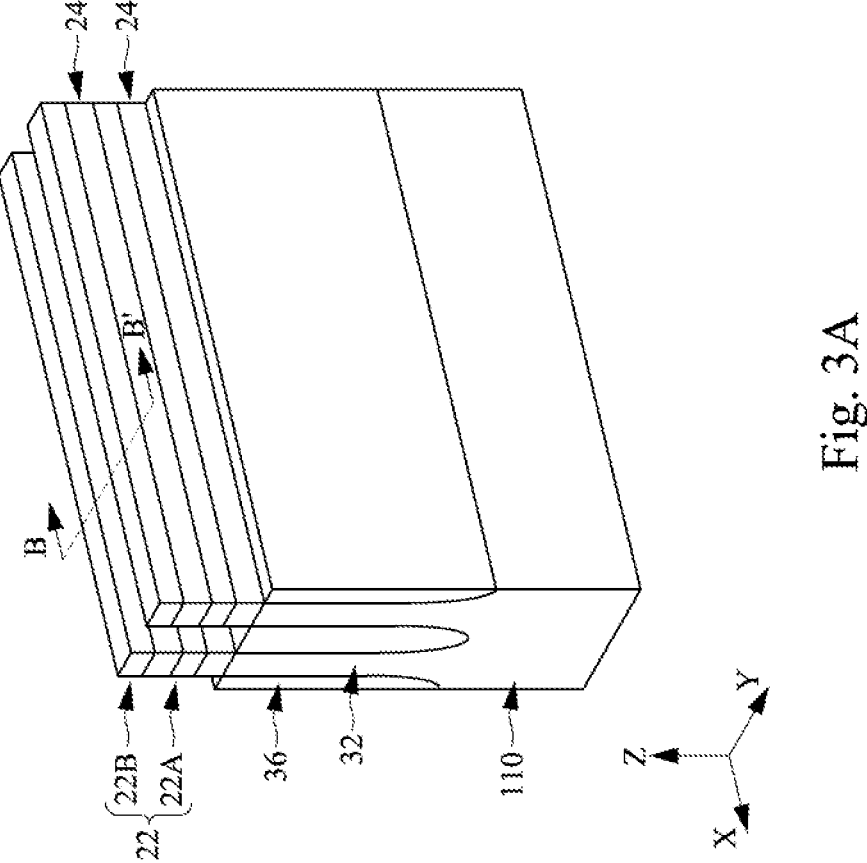

In some embodiments, the lengths (e.g., measured in the X-direction) of the channels 22A, 22B, 22C may be different from each other, for example due to tapering during a fin etching process (see FIGS. 3A, 3B). In some embodiments, length of the channel 22A may be less than a length of the channel 22B. The channels 22A, 22B, 22C each may not have uniform thickness (e.g., along the X-axis direction), for example due to a channel trimming process used to expand spacing (e.g., measured in the Z-axis direction) between the channels 22A, 22B, 22C to increase gate structure fabrication process window. For example, a middle portion of each of the channels 22A, 22B, 22C may be thinner than the two ends of each of the channels 22A, 22B, 22C. Such shape may be collectively referred to as a "dog-bone" shape.

In some embodiments, the spacing between the channels 22A, 22B, 22C (e.g., between the channel 22B and the channel 22A or the channel 22C) is in a range between about 8 nanometers (nm) and about 12 nm. In some embodiments, a thickness (e.g., measured in the Z-direction) of each of the channels 22A, 22B, 22C is in a range between about 5 nm and about 8 nm. In some embodiments, a width (e.g., measured in the Y-direction, shown in FIG. 1E, orthogonal to the X-Z plane) of each of the channels 22A, 22B, 22C is at least about 8 nm.

The gate structure 200 is disposed over and between the channels 22A, 22B, 22C respectively. In some embodiments, the gate structure 200 is disposed over and between the channels 22A, 22B, 22C which are silicon channels for N-type devices or silicon germanium channels for P-type devices. In some embodiments, the gate structure 200 includes an interfacial layer (IL) 210, one or more gate dielectric layers 600, one or more work function tuning layers 900 (see FIG. 13) and a metal core layer 290.

The interfacial layer 210, which may be an oxide of the material of the channels 22A, 22B, 22C is formed on exposed areas of the channels 22A, 22B, 22C and the top surface of the fin 32. The interfacial layer 210 promotes adhesion of the gate dielectric layers 600 to the channels 22A, 22B. In some embodiments, the interfacial layer 210 has thickness of about 5 Angstroms (A) to about 50 Angstroms (A). In some embodiments, the interfacial layer 210 has thickness of about 10 A. The interfacial layer 210 having thickness that is too thin may exhibit voids or insufficient adhesion properties. The interfacial layer 210 being too thick consumes gate fill window, which is related to threshold voltage tuning and resistance. In some embodiments, the interfacial layer 210 is doped with a dipole, such as lanthanum, for threshold voltage tuning.

In some embodiments, the gate dielectric layer 600 includes at least one high-k gate dielectric material, which may refer to dielectric materials having a high dielectric constant that is greater than a dielectric constant of silicon oxide (k≈3.9). Example high-k dielectric materials include $HfO_2$, HfSiO, HfSiON, HfTaO, HfTiO, HfZrO, $ZrO_2$, $Ta_2O_5$, or combinations thereof. In some embodiments, the gate dielectric layer 600 has thickness of about 5 A to about 100 A. The gate dielectric layer 600 may be a single layer or a multilayer.

The gate structure 200 also includes metal core layer 290. The metal core layer 290 may include a conductive material such as Co, W, Ru, combinations thereof, or the like. In some embodiments, the metal core layer 290 is or includes a Co-, W- or Ru-based compound or alloy including one or more elements, such as Zr, Sn, Ag, Cu, Au, Al, Ca, Be, Mg, Rh, Na, Ir, W, Mo, Zn, Ni, K, Co, Cd, Ru, In, Os, Si, Ge, Mn, combinations thereof, or the like. Between the channels 22A, 22B, the metal core layer 290 is circumferentially surrounded (in the cross-sectional view) by the one or more work function metal layers 900, which are then circumferentially surrounded by the gate dielectric layers 600, which are circumferentially surrounded by the interfacial layer 210. The gate structure 200 may also include a glue layer that is formed between the one or more work function layers 900 and the metal core layer 290 to increase adhesion. The glue layer is not specifically illustrated in FIG. 1A for simplicity.

The nanostructure device 20P may further include source/drain contacts 120 that are formed over the source/drain features 82. The source/drain contacts 120 may include a core layer that is or includes a conductive material such as tungsten, ruthenium, cobalt, copper, titanium, titanium nitride, tantalum, tantalum nitride, iridium, molybdenum, nickel, aluminum, or combinations thereof. The core layer may be surrounded by one or more liner (or, "barrier") layers, such as SiN or TiN, which help prevent or reduce diffusion of materials from and into the source/drain contacts 120. In some embodiments, height of the source/drain contacts 120 may be in a range of about 1 nm to about 50 nm.

Silicide layers 118 may be formed between the source/drain features 82 and the source/drain contacts 120, at least to reduce the source/drain contact resistance. In some embodiments, the silicide layer 118 is or includes TiSi, CrSi, TaSi, MoSi, ZrSi, HfSi, ScSi, Ysi, HoSi, TbSI, GdSi, LuSi, DySi, ErSi, YbSi, or the like. In some embodiments, the silicide layer 118 is or includes NiSi, CoSi, MnSi, Wsi, FeSi, RhSi, PdSi, RuSi, PtSi, IrSi, OsSi, or the like. The silicide layer 118 may have thickness in a range of about 1 nm to about 10 nm. Thickness lower than about 1 nm may lead to an insufficient reduction in contact resistance. Thickness above about 10 nm may cause electrical shorting with the nanostructures 22. In some embodiments, the silicide layer 118 is present below, and in contact with, etch stop layer 131, depicted in FIG. 1E.

Figure 1E:
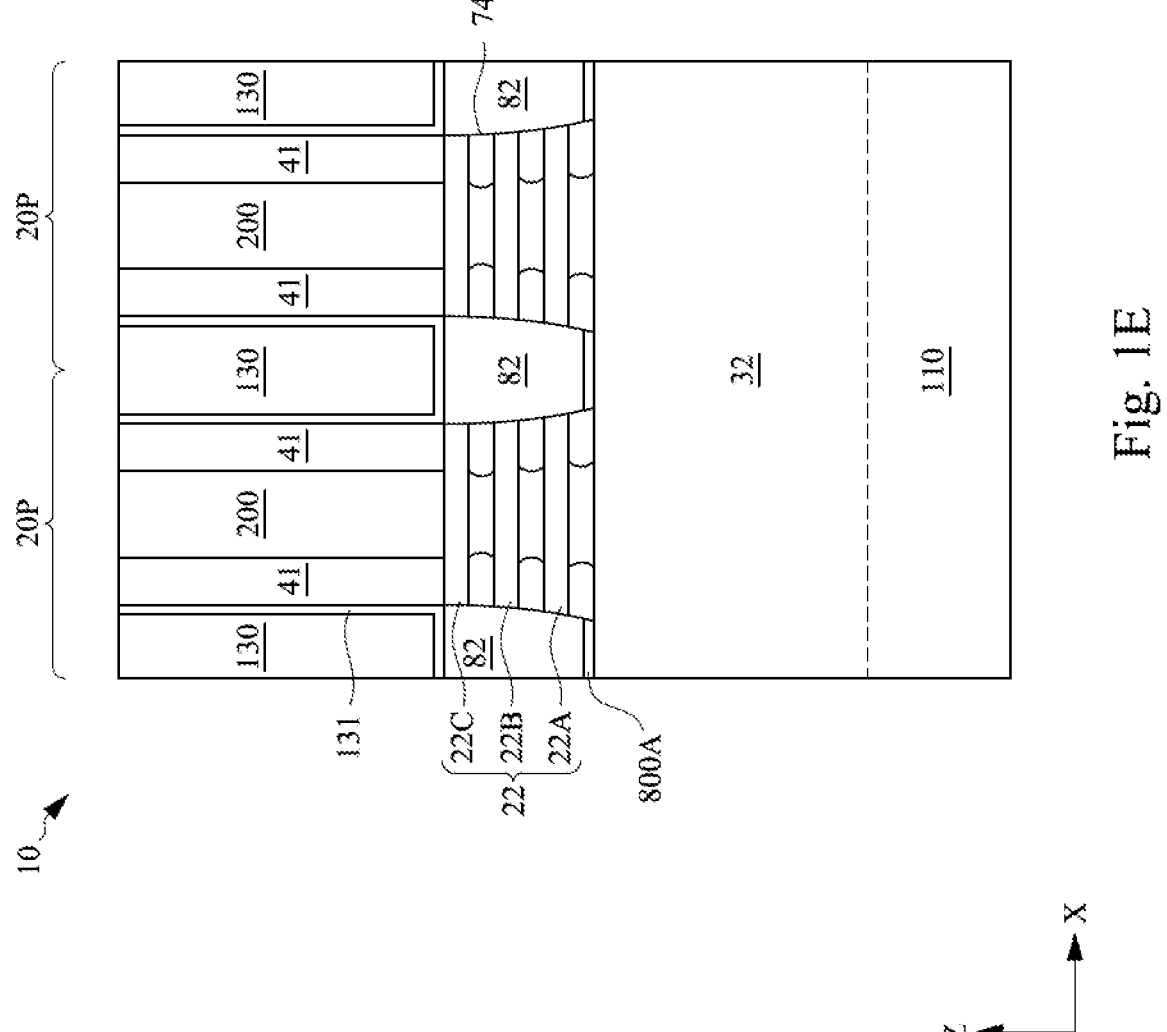

FIG. 1E depicts a detailed diagrammatic cross-sectional view of the nanostructure device 20P in the X-Z plane. The nanostructure device 20P may include an interlayer dielectric (ILD) 130. The ILD 130 provides electrical isolation between the various components of the nanostructure device 20P discussed above, for example between neighboring pairs of the source/drain contacts 120. An etch stop layer 131 may be formed prior to forming the ILD 130 and may be positioned laterally between the ILD 130 and gate spacers 41 and vertically between the ILD 130 and the source/drain features 82. In some embodiments, the etch stop layer 131 is or includes SiN, SiCN, SiC, SiOC, SiOCN, $HfO_2$, $ZrO_2$, $ZrAlO_x$, $HfAlO_x$, $HfSiO_x$, $Al_2O_3$, or other suitable material. In some embodiments, thickness of the etch stop layer is in a range of about 1 nm to about 5 nm. In some embodiments, where the ILD 130 is not present (e.g., is removed completely prior to formation of the source/drain contacts 120), the etch stop layer 131 may be in contact with the source/drain contact 120. The etch stop layer 131 may be trimmed, for example, in the X-axis direction prior to formation of the source/drain contact 120 to improve fill quality of the source/drain contact 120.

The nanostructure device 20P includes the gate spacers 41 that are disposed on sidewalls of the metal core layer 290, the gate dielectric layer 600 and the IL 210 above the channel 22A, and inner spacers 74 that are disposed on sidewalls of the IL 210 and/or the gate dielectric layer 600 between the channels 22A, 22B, 22C. The inner spacers 74 are also disposed between the channels 22A, 22B, 22C. In the embodiment depicted in FIG. 1E, the gate spacers 41 include a single spacer layer. In some embodiments, the gate spacers 41 include a second spacer layer on a first spacer layer. The first and second spacer layers may each include a dielectric material, for example a low-k material such as SiOCN, SiON, SiN, SiCN, SiOC or the like. In some embodiments, the second spacer layer is not present. Material of the first and second spacer layers may be the same as or different from each other. Generally, an upper portion of the second spacer layer (or the first spacer layer when the second spacer layer is not present) may be removed partially or fully to increase aspect ratio of an opening through which the source/drain region 82 is formed.

Figure 13:
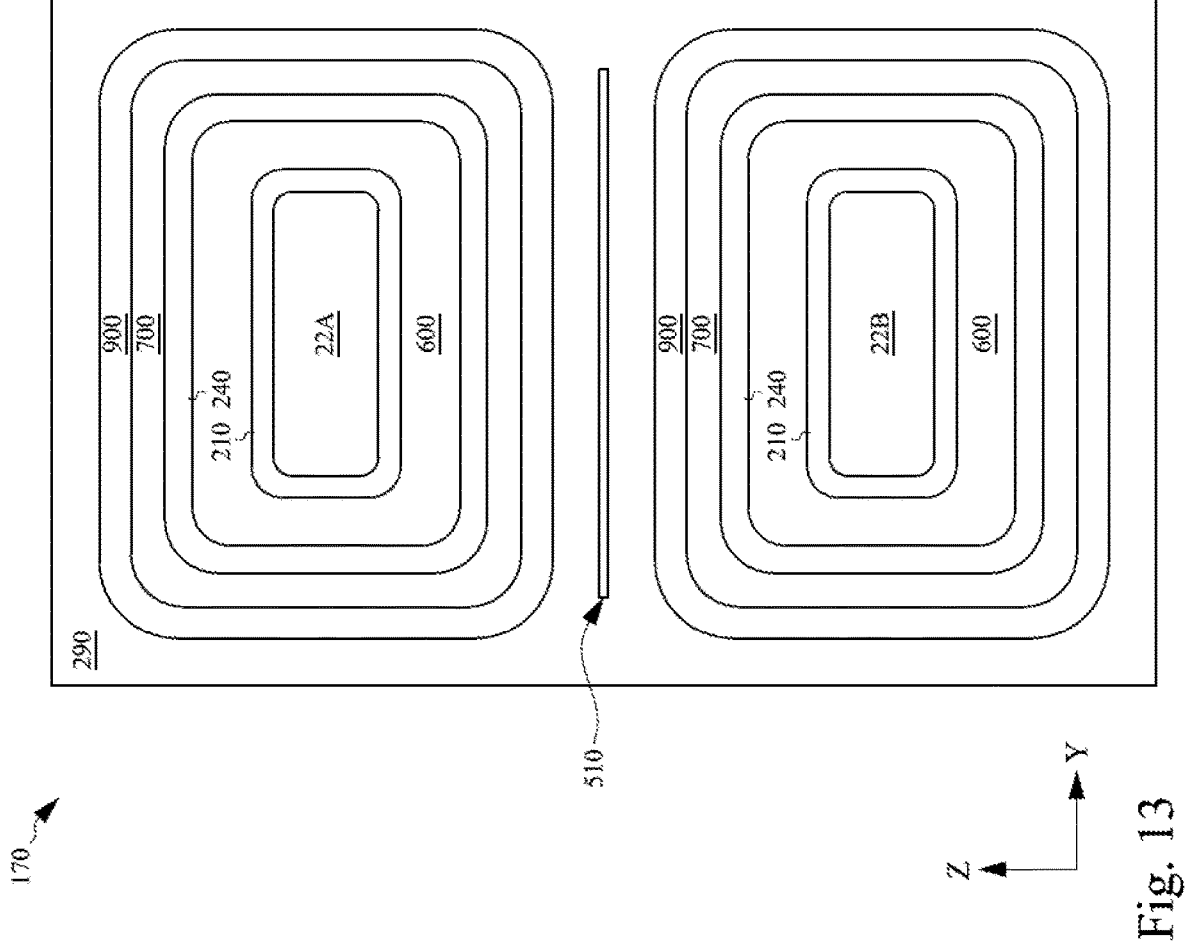
Figure 14:
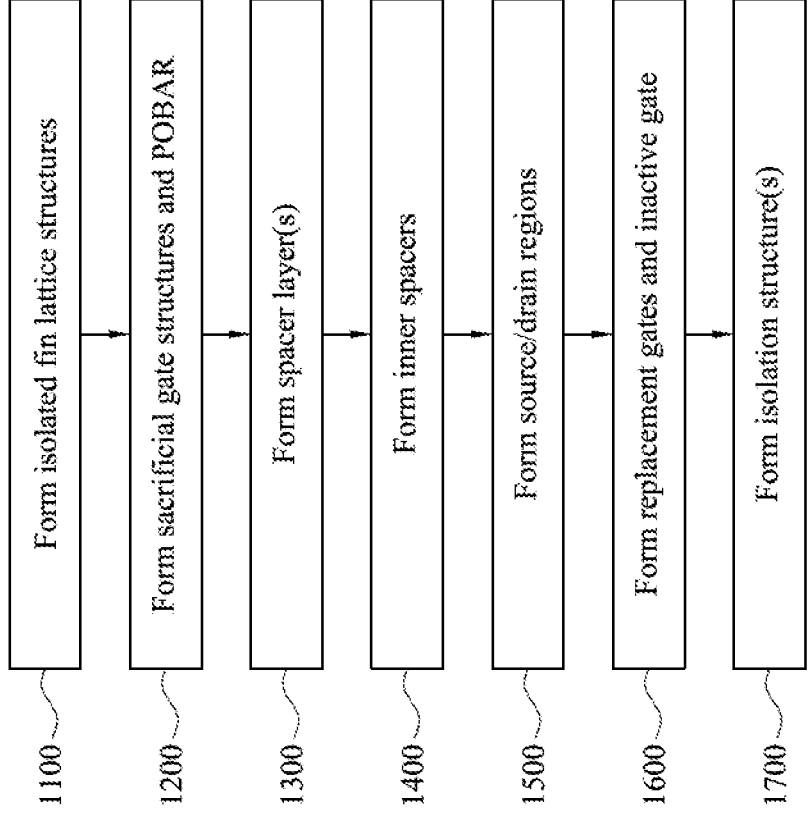
FIG. 14 is a flowchart of a method of forming an IC device in accordance with various embodiments.
Figure 14:

FIG. 14 illustrates a flowchart of method 1000 for forming an IC device or a portion thereof from a workpiece, according to one or more aspects of the present disclosure. Method 1000 is merely an example and is not intended to limit the present disclosure to what is explicitly illustrated in method 1000. Additional acts can be provided before, during and after the method 1000 and some acts described can be replaced, eliminated, or moved around for additional embodiments of the method. Not all acts are described herein in detail for reasons of simplicity. Method 1000 is described below in conjunction with fragmentary perspective and/or cross-sectional views of a workpiece, shown in FIGS. 2A-13, at different stages of fabrication according to embodiments of method 1000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

FIGS. 2A through 13 are views of intermediate stages in the manufacturing of FETs, such as nanostructure FETs, in accordance with some embodiments.

Figures 2A, 2B:
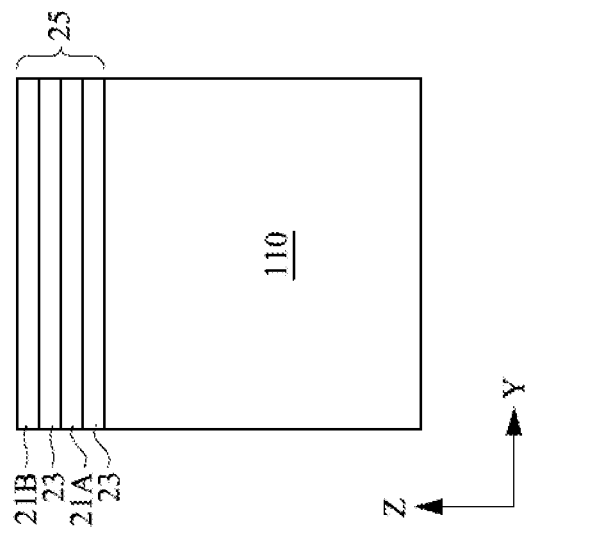

In FIG. 2A and FIG. 2B, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Further in FIG. 2A and FIG. 2B, a multi-layer stack 25 or "lattice" is formed over the substrate 110 of alternating layers of first semiconductor layers 21A, 21B (collectively referred to as first semiconductor layers 21) and second semiconductor layers 23. Two layers 21A, 21B are depicted in FIGS. 2A and 2B. When three channels 22A, 22B, 22C are to be formed, the stack 25 may include an additionally pair of first and second semiconductor layers that are directly on top of the layer 21B. In some embodiments, the first semiconductor layers 21 may be formed of a first semiconductor material suitable for n-type nano-FETs, such as silicon, silicon carbide, or the like, and the second semiconductor layers 23 may be formed of a second semiconductor material suitable for p-type nano-FETs, such as silicon germanium or the like. Each of the layers 21, 23 of the multi-layer stack 25 may be epitaxially grown using a process such as chemical vapor deposition (CVD), atomic layer deposition (ALD), vapor phase epitaxy (VPE), molecular beam epitaxy (MBE), or the like.

Two layers of each of the first semiconductor layers 21 and the second semiconductor layers 23 are illustrated. In some embodiments, the multi-layer stack 25 may include one each or three or more each of the first semiconductor layers 21 and the second semiconductor layers 23. Although the multi-layer stack 25 is illustrated as including a second semiconductor layer 23 as the bottommost layer, in some embodiments, the bottommost layer of the multi-layer stack 25 may be a first semiconductor layer 21.

Due to high etch selectivity between the first semiconductor materials and the second semiconductor materials, the second semiconductor layers 23 of the second semiconductor material may be removed without significantly removing the first semiconductor layers 21 of the first semiconductor material, thereby allowing the first semiconductor layers 21 to be patterned to form channel regions of nano-FETs. In some embodiments, the first semiconductor layers 21 are removed and the second semiconductor layers 23 are patterned to form channel regions. The high etch selectivity allows the first semiconductor layers 21 of the first semiconductor material to be removed without significantly removing the second semiconductor layers 23 of the second semiconductor material, thereby allowing the second semiconductor layers 23 to be patterned to form channel regions of nano-FETs.

In FIG. 3A and FIG. 3B, fins 32 are formed in the substrate 110 and nanostructures 22, 24 are formed in the multi-layer stack 25 corresponding to act 1100 of FIG. 14. In some embodiments, the nanostructures 22, 24 and the fins 32 may be formed by etching trenches in the multi-layer stack 25 and the substrate 110. The etching may be any acceptable etch process, such as a reactive ion etch (RIE), neutral beam etch (NBE), the like, or a combination thereof. The etching may be anisotropic. First nanostructures 22A, 22B (also referred to as "channels 22" below) are formed from the first semiconductor layers 21, and second nanostructures 24 are formed from the second semiconductor layers 23. Distance CD1 between adjacent fins 32 and nanostructures 22, 24 may be from about 18 nm to about 100 nm. A portion of the device 10 is illustrated in FIGS. 3A and 3B including two fins 32 for simplicity of illustration. The method 1000 illustrated in FIGS. 2A-13 may be extended to any number of fins, and are not limited to the two fins 32 shown in FIGS. 3A-13.

The fins 32 and the nanostructures 22, 24 may be patterned by any suitable method. For example, one or more photolithography processes, including double-patterning or multi-patterning processes, may be used to form the fins 32 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 32.

FIGS. 3A and 3B illustrate the fins 32 having tapered sidewalls, such that a width of each of the fins 32 and/or the nanostructures 22, 24 continuously increases in a direction towards the substrate 110. In such embodiments, each of the nanostructures 22, 24 may have a different width and be trapezoidal in shape. In other embodiments, the sidewalls are substantially vertical (non-tapered), such that width of the fins 32 and the nanostructures 22, 24 is substantially similar, and each of the nanostructures 22, 24 is rectangular in shape.

In FIGS. 3A and 3B, isolation regions 36, which may be shallow trench isolation (STI) regions, are formed adjacent the fins 32. The isolation regions 36 may be formed by depositing an insulation material over the substrate 110, the fins 32, and nanostructures 22, 24, and between adjacent fins 32 and nanostructures 22, 24. The insulation material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 110, the fins 32, and the nanostructures 22, 24. Thereafter, a core material, such as those discussed above may be formed over the liner.

The insulation material undergoes a removal process, such as a chemical mechanical polish (CMP), an etch-back process, combinations thereof, or the like, to remove excess insulation material over the nanostructures 22, 24. Top surfaces of the nanostructures 22, 24 may be exposed and level with the insulation material after the removal process is complete.

The insulation material is then recessed to form the isolation regions 36. After recessing, the nanostructures 22, 24 and upper portions of the fins 32 may protrude from between neighboring isolation regions 36. The isolation regions 36 may have top surfaces that are flat as illustrated, convex, concave, or a combination thereof. In some embodiments, the isolation regions 36 are recessed by an acceptable etching process, such as an oxide removal using, for example, dilute hydrofluoric acid (dHF), which is selective to the insulation material and leaves the fins 32 and the nanostructures 22, 24 substantially unaltered.

FIGS. 2A through 3B illustrate one embodiment (e.g., etch last) of forming the fins 32 and the nanostructures 22, 24. In some embodiments, the fins 32 and/or the nanostructures 22, 24 are epitaxially grown in trenches in a dielectric layer (e.g., etch first). The epitaxial structures may comprise the alternating semiconductor materials discussed above, such as the first semiconductor materials and the second semiconductor materials.

Further in FIG. 3A and FIG. 3B, appropriate wells (not separately illustrated) may be formed in the fins 32, the nanostructures 22, 24, and/or the isolation regions 36. Using masks, an n-type impurity implant may be performed in p-type regions of the substrate 110, and a p-type impurity implant may be performed in n-type regions of the substrate 110. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 32 and the nanostructures 22, 24 may obviate separate implantations, although in situ and implantation doping may be used together.

Figure 4A:
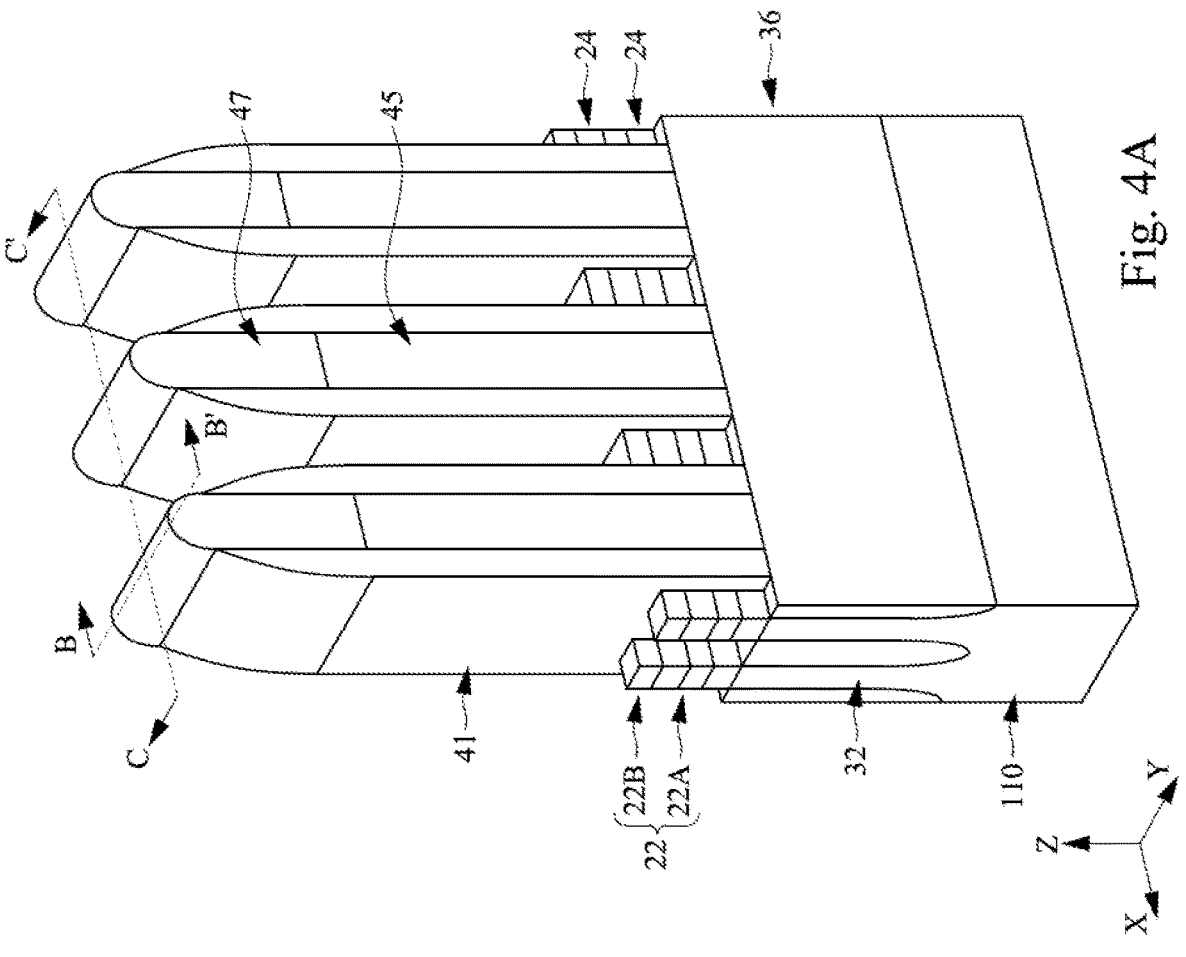
Figure 4C:
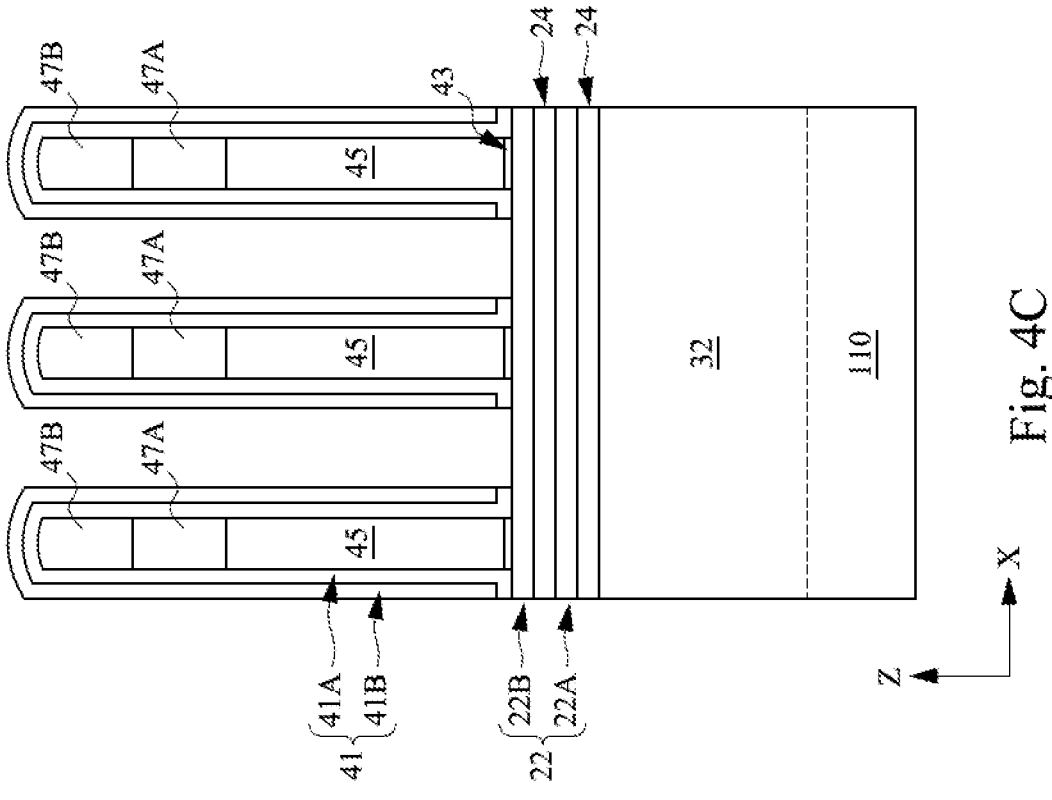
Figure 4B:
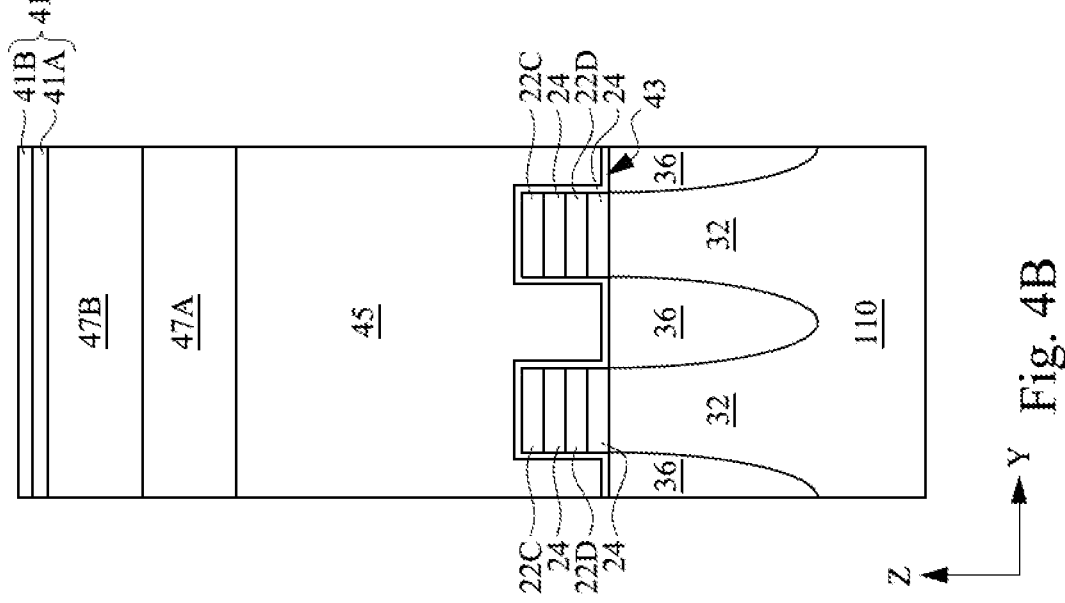

In FIGS. 4A-4C, dummy or sacrificial gate structures 40 are formed over the fins 32 and/or the nanostructures 22, 24, corresponding to act 1200 of FIG. 14. A dummy or sacrificial gate layer 45 is formed over the fins 32 and/or the nanostructures 22, 24. The dummy gate layer 45 may be made of materials that have a high etching selectivity relative to the isolation regions 36. The dummy gate layer 45 may be a conductive, semiconductive, or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 45 may be deposited by physical vapor deposition (PVD), CVD, sputter deposition, or other techniques for depositing the selected material. A mask layer 47 is formed over the dummy gate layer 45, and may include, for example, silicon nitride, silicon oxynitride, or the like. In some embodiments, a dummy gate dielectric 43 is formed before the dummy gate layer 45 between the dummy gate layer 45 and the fins 32 and/or the nanostructures 22, 24. In some embodiments, the mask layer 47 includes a first mask layer 47A in contact with the dummy gate layer 45, and a second mask layer 47B overlying the first mask layer 47A. The first mask layer 47A may be or include the same or different material as that of the second mask layer 47B. The sacrificial gate structures 40 may also be referred to as poly gates or "PO" throughout. Spacing in the X-axis direction between the sacrificial gate structures 40 may be associated with a pitch, which may be referred to as a poly pitch or PO pitch.

A spacer layer 41 is formed over sidewalls of the mask layer 47 and the dummy gate layer 45, corresponding to act 1300 of FIG. 14. The spacer layer 41 is made of an insulating material, such as SiOCN, SiOC, SiCN or the like (or any of the materials described with reference to FIGS. 1A-1E), and may have a single-layer structure or a multi-layer structure including a plurality of dielectric layers, in accordance with some embodiments. The spacer layer 41 may be formed by depositing a spacer material layer (not shown) over the mask layer 47 and the dummy gate layer 45. Portions of the spacer material layer between dummy gate structures 40 are removed using an anisotropic etching process, in accordance with some embodiments. In some embodiments, as shown in detail in FIGS. 4B, 4C, the spacer layer 41 includes a first spacer layer 41A in contact with the nanostructure 22B, the dummy gate dielectric 43, the dummy gate layer 45 and the first and second mask layers 47A, 47B. A second spacer layer 41B of the spacer layer 41 may be in contact with the first spacer layer 41A and the nanostructure 22B. In some embodiments, the second spacer layer 41B is separated from the nanostructure 22B by the first spacer layer 41A, as depicted in FIG. 4C. The first spacer layer 41A may be or include the same or different material as that of the second spacer layer 41B.

FIGS. 4D-4N are diagrammatic plan and cross-sectional views that depict embodiments of forming a POBAR 500 in accordance with various aspects of the present disclosure.

Figures 4D, 4E:
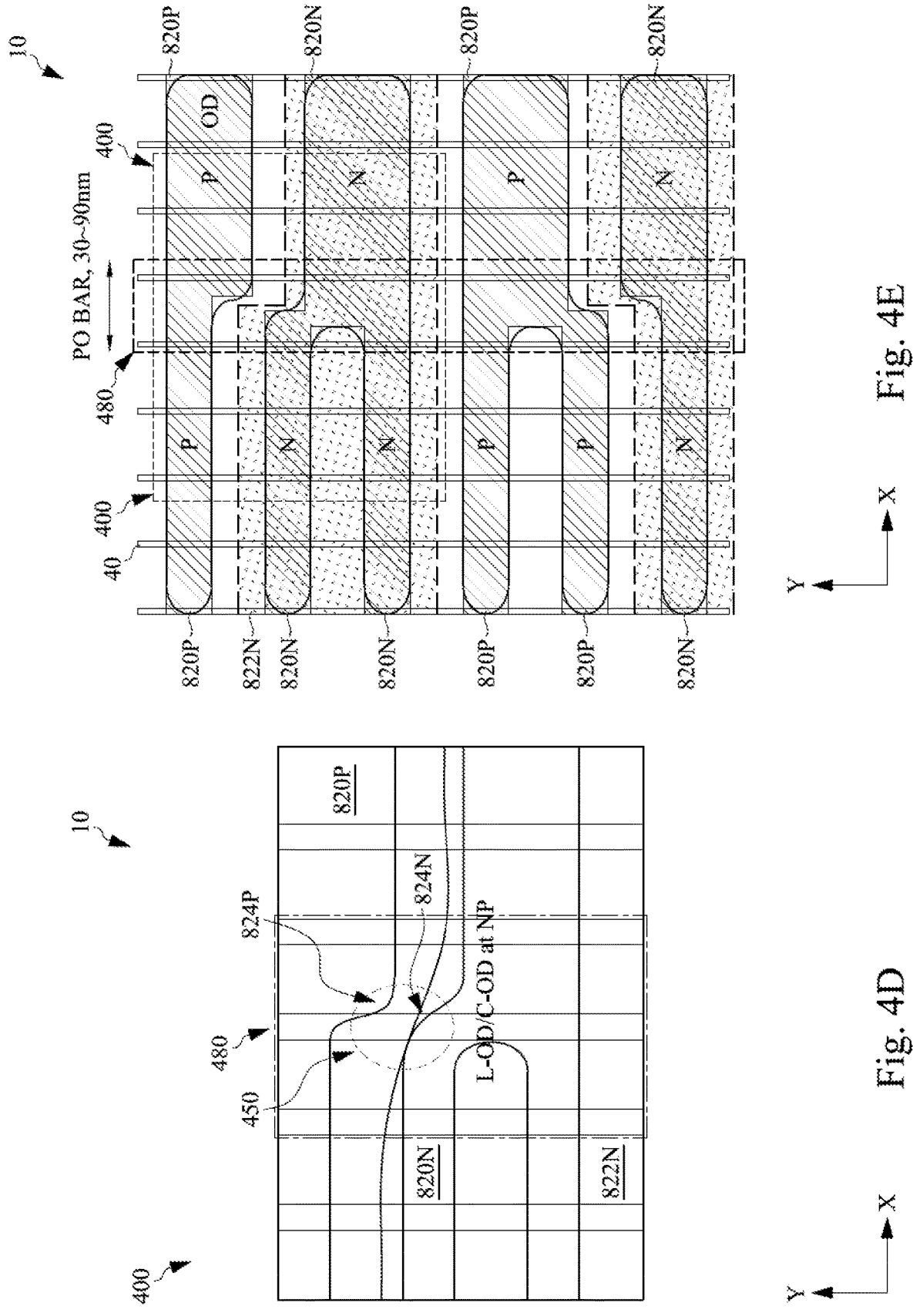

FIG. 4D is a detailed view of a region 400 of FIG. 4E. In FIG. 4D, an L-shaped first OD 820P is adjacent to a C-shaped second OD 820N. In some embodiments, the first OD 820P is a P-type OD and the second OD 820N is an N-type OD. "L-shaped" and "C-shaped" may refer to a type of jog associated with an OD. For example, an L-shaped OD may have one side that is wider than another side. As depicted in FIG. 4E, on one side of a transition region 480, the uppermost P-type OD 820P has a first region on one side that is wider in the Y-axis direction than a second region on another side. Similarly, the lowermost N-type OD 820N has a first region on one side that is wider in the Y-axis direction than a second region thereof that is on another side. A C-shaped OD may have a first region on one side that is wide, and have two narrower second regions on another side that are not as wide as the first region. For example, the middle N- and P-type ODs 820N, 820P in FIG. 4E each have a wider first region on the one side and two narrower second regions on the another side. Arrangement of L- and C-shaped ODs as depicted in FIG. 4E may be beneficial to reduce layout area.

In the layout arrangement depicted in FIG. 4E, transitions from the first regions to the second regions are positioned in a 1-CPP-wide region, namely the transition region 480. For example, a smallest pitch between directly adjacent dummy gate structures 40 may be in a range of about 30 nm to about 90 nm. Namely, dummy gate structures 40 may be arranged at regular intervals along the X-axis direction, and the regular interval may be, for example, 30 nanometers. As such, the transitions from the first regions to the second regions in the L- and C-shaped ODs may extend over a narrow, 30 nanometer, dimension in the X-axis direction. This can result in insufficient spacing between neighboring ODs. For example, as depicted in region 450 of FIG. 4D, a first corner region 824P of the first OD 820P may be separated from a second corner region 824N of the second OD 820N by only a small distance. In another example, the second OD 820N may be associated with a second jog region 822N. When source/drain regions 82N are formed up to edges of the second jog region 822N, separation between the source/drain regions 82N and neighboring source/drain regions 82P of the first OD 820P may also be insufficient. As a result, EPI defect noise may occur between one or more source/drain regions 82P of the first OD 820P and one or more source/drain regions 82N of the second OD 820N.

To reduce the occurrence of EPI defects and/or EPI defect noise in the IC device 10, a polysilicon bar or "POBAR" may be formed during formation of the sacrificial gates 40, as will be described below with reference to FIGS. 4F-4N. Generally, the POBAR may be formed simultaneously with formation of the sacrificial gates 40 and may be the same material as the sacrificial gates 40 described above with reference to FIGS. 4A-4C. Namely, the POBAR may be a conductive, semiconductive, or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The POBAR is wider in the X-axis direction than the sacrificial gates 40, but may have similar or the same height in the Z-axis direction as the sacrificial gates 40. The POBAR is formed to cover entirely or partially the transition region 480 described with reference to FIGS. 4D and 4E above.

Figures 4F, 4G:
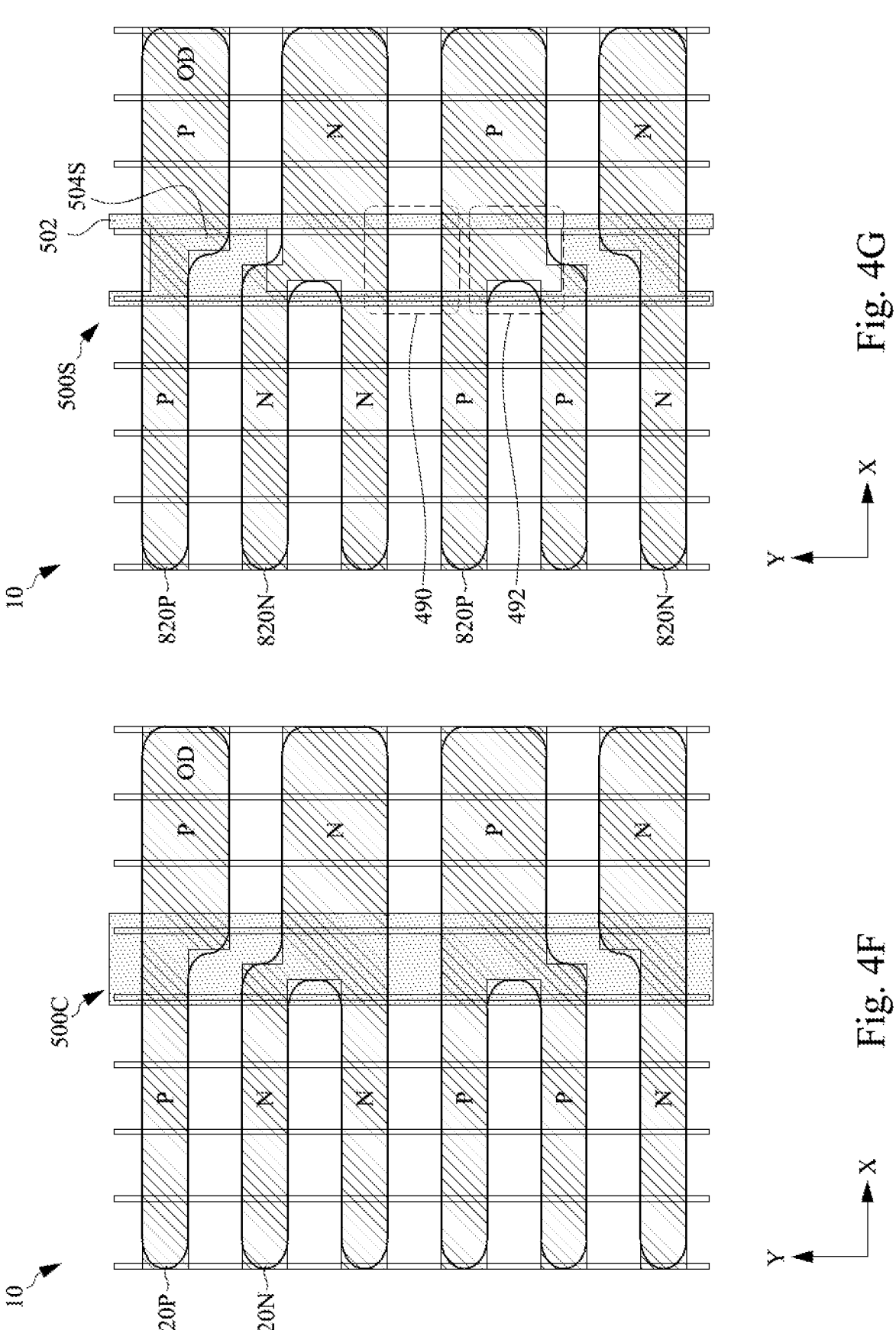

FIG. 4F depicts an embodiment of a continuous POBAR 500C that extends continuously from one end of the circuit region to another end of the circuit region. The continuous POBAR 500C may have substantially uniform width in the X-axis direction along its entire length in the Y-axis direction, as shown. The continuous POBAR 500C may be formed having width that extends across a single poly pitch plus a single sacrificial gate width. Namely, if two directly adjacent sacrificial gates 40 were to be formed at a selected pitch, the POBAR 500C would completely overlap the two adjacent sacrificial gates 40 and all intervening space therebetween. For example, for sacrificial gates 40 arranged along the X-axis direction at a regular interval or "poly pitch" of 30 nm, each sacrificial gate 40 having the same width of 5 nm, the width of the POBAR 500C would be at least 35 nm or substantially 35 nm (e.g., 34 nm to 36 nm, inclusive). Aligning and sizing the POBAR 500C in accordance with the poly pitch and sacrificial gate width is beneficial to achieving a simpler layout with consistent spacing, which may reduce mask feature variation between the POBAR 500C and the neighboring sacrificial gates 40. In some embodiments, however, the POBAR 500C may be positioned in such a way as to not be equidistant from directly adjacent sacrificial gates 40 on either side thereof along the X-axis direction, which may be beneficial in achieving improved separation between neighboring source/drain regions 82P, 82N on either side of the POBAR 500C. The continuous POBAR 500C may be said to cover the transition region 480 completely.

In FIG. 4G, a first partial POBAR 500S is formed instead of the continuous POBAR 500C. The first partial POBAR 500S is similar in many respects to the continuous POBAR 500C. For example, the first partial POBAR 500S may include continuous regions 502 that are positioned where sacrificial gates 40 would normally be formed. The first partial POBAR 500S includes small intervening regions 504S that cover neighboring protruding corner regions of directly adjacent ODs 820P, 820N, as shown. Namely, the region 450 depicted in FIG. 4D is covered by or overlapped by the small intervening region 504S, but a region 490 in which two straight regions of directly adjacent ODs 820P, 820N are neighboring is not covered or is exposed by the first partial POBAR 500S (other than coverage by the continuous regions 502). A second region 492 that includes corners that are not in close proximity to other corners of another OD is also exposed by the first partial POBAR 500S (other than the continuous regions 502). For example, three internal or "non-protruding" corners of the C-shaped first OD 820P are exposed by the first partial POBAR 500S.

Figure 4H:
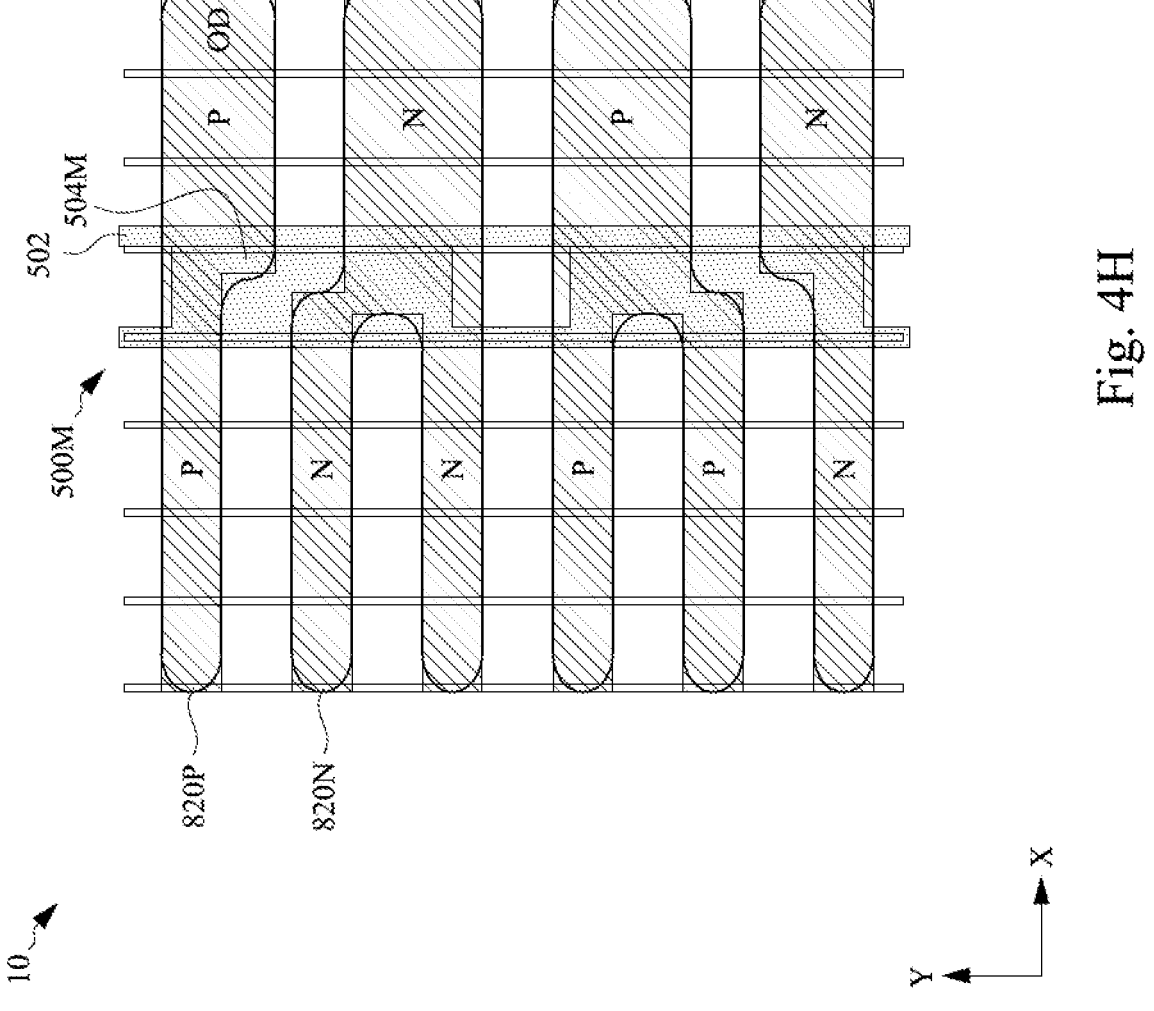

In FIG. 4H, a second partial POBAR 500M is formed instead of the continuous POBAR 500C or the first partial POBAR 500S. The second partial POBAR 500M is similar in many respects to the first partial POBAR 500S. The second partial POBAR 500M includes the continuous regions 502. The second partial POBAR 500M includes medium intervening regions 504M that cover all corner regions (e.g., protruding and non-protruding) of the first and second ODs 820P, 820N, but leave straight regions exposed, as shown.

Figure 4I:
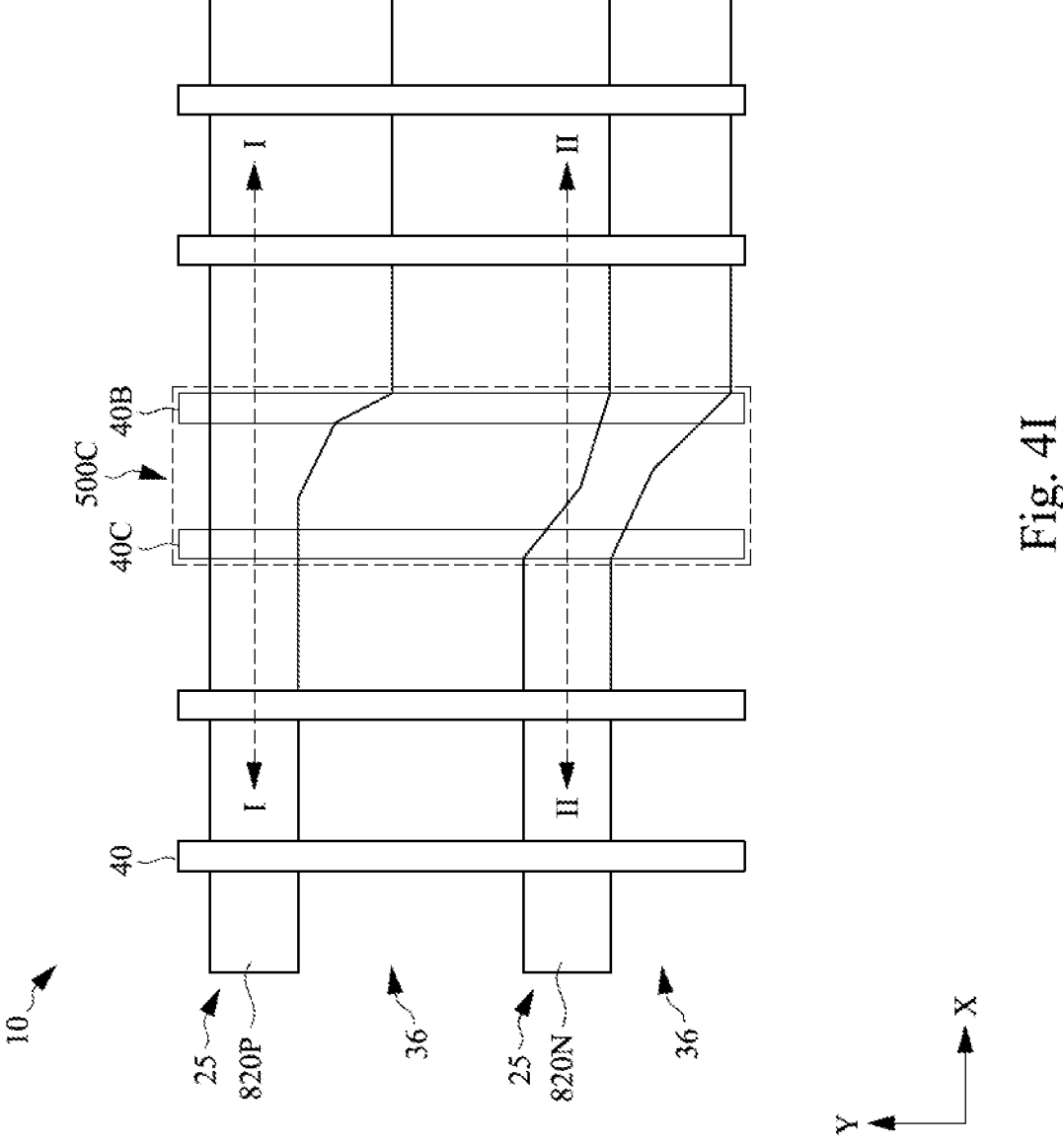
Figure 4J:
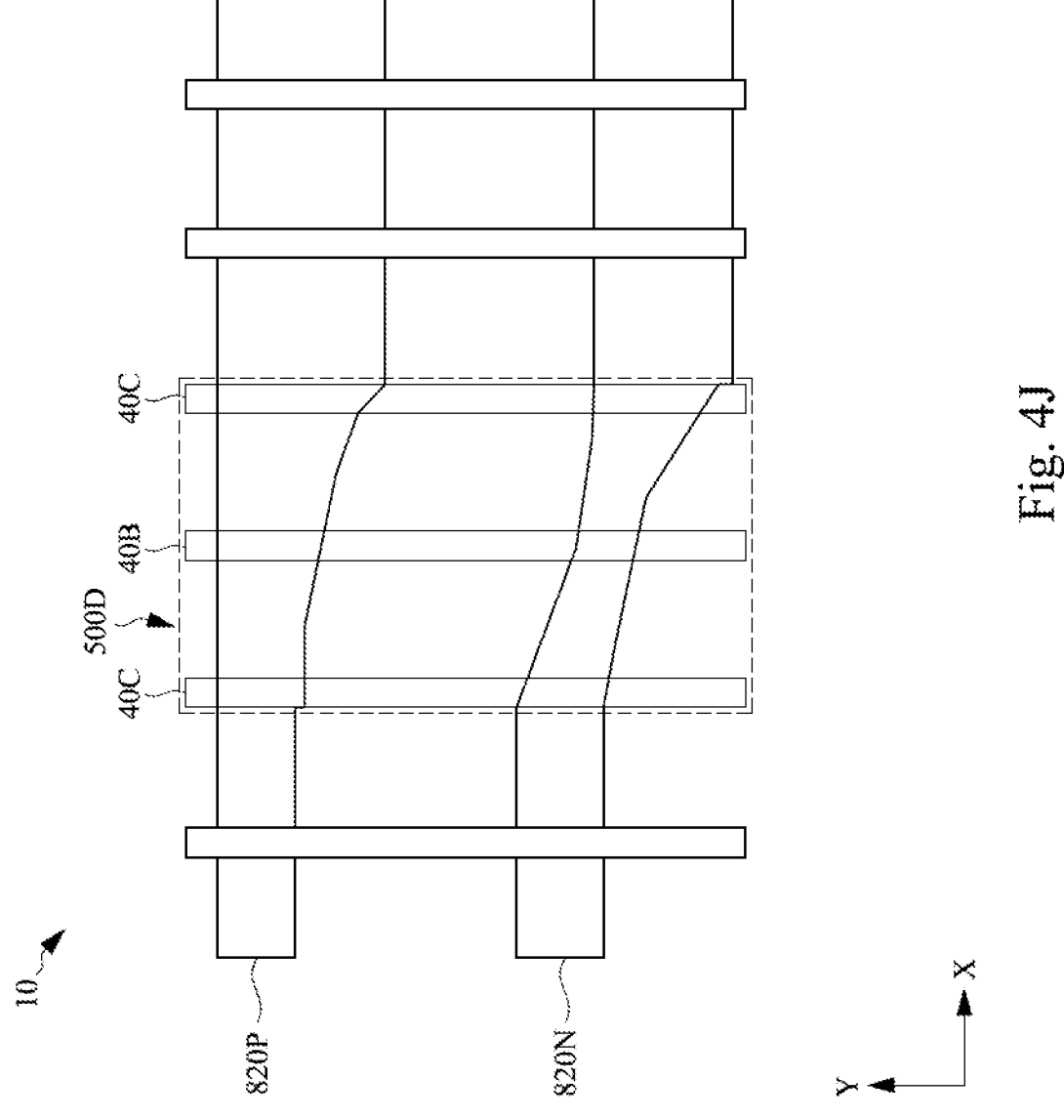
Figure 4K:
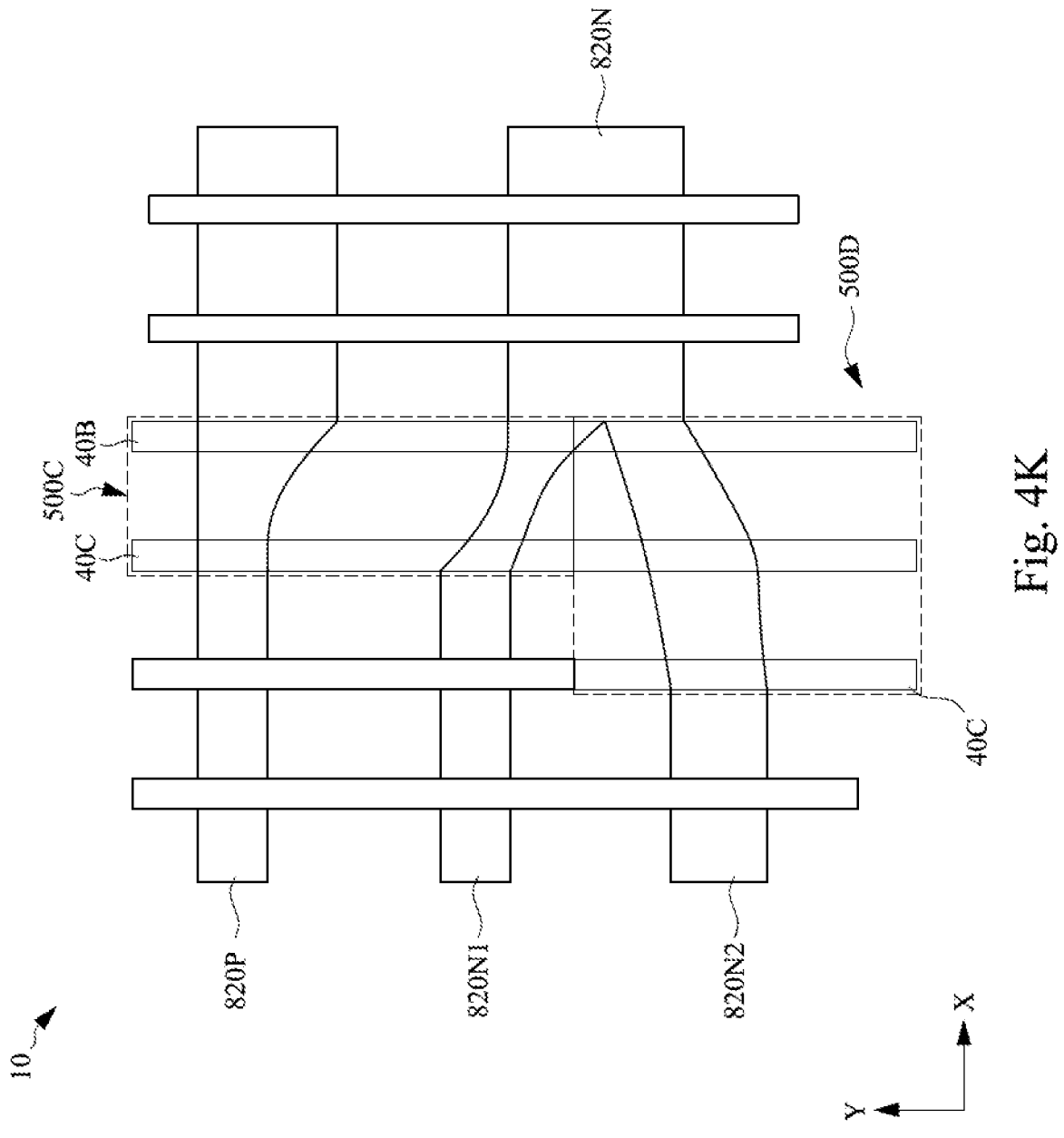

FIGS. 4I-4K are diagrams illustrating the continuous POBAR 500C in accordance with various embodiments. Although the depictions in FIGS. 4I-4K and related description are provided in the context of continuous POBARs 500C, 500D, it should be understood that the embodiments of FIGS. 4I-4K can also be combined with the partial POBARs 500S, 500M described with reference to FIGS. 4G and 4H.

In FIG. 4I, the continuous POBAR 500C is substantially similar to or the same as the continuous POBAR 500C described with reference to FIG. 4F. Namely, the continuous POBAR 500C has width that is equal to one poly pitch plus one sacrificial gate width. As shown, the continuous POBAR 500C extends from where a first sacrificial gate 40A would have been formed to where a second sacrificial gate 40B would have been formed. Cross-sectional lines I-I and II-II are depicted in FIG. 4I that will be referred to in the description of subsequent Figures, such as FIGS. 4L-4N and FIGS. 9B and 9C.

In FIG. 4J, a wide or double-wide POBAR 500D is similar in many respects to the continuous POBAR 500C, but has width that extends across two or more poly pitches plus one sacrificial gate width, as shown. In some embodiments, a POBAR is formed over a transition region 480 that extends over more than one poly pitch. As shown, the double-wide POBAR 500D extends from where the first sacrificial gate 40A would have been formed to where a third sacrificial gate 40C would have been formed, with the position where the second sacrificial gate 40B would have been formed therebetween. In the embodiment depicted in FIG. 4J, the wide POBAR 500D extends over two poly pitches plus one sacrificial gate width. In some embodiments, the wide POBAR 500D may extend over three or more poly pitches plus one sacrificial gate width.

In FIG. 4K, a combination of the continuous POBAR 500C and the wide POBAR 500D is formed over the transition region 480. In some embodiments, for example, a single C-shaped OD may include two different transition region widths, as shown. Namely, an upper fork 820N1 of the C-shaped OD 820N may have a transition region that extends over a single poly pitch, and a lower fork 820N2 of the C-shaped OD 820N may have a transition region that extends over two poly pitches. When forming the sacrificial gates 40, a POBAR having different widths in the X-axis direction may be formed. As such, the POBAR may include a single-pitch POBAR 500C and a double-pitch POBAR 500D. In some embodiments, the POBAR 500D has width exceeding two poly pitches, such as three poly pitches or more. The POBAR 500C may cover or overlap the upper fork 820N1 and the POBAR 500D may cover or overlap the lower fork 820N2. As shown in FIG. 4K, the POBAR 500D may cover a portion of the upper fork 820N1, such that the POBAR 500C partially covers the upper fork 820N1.

Figure 4L:
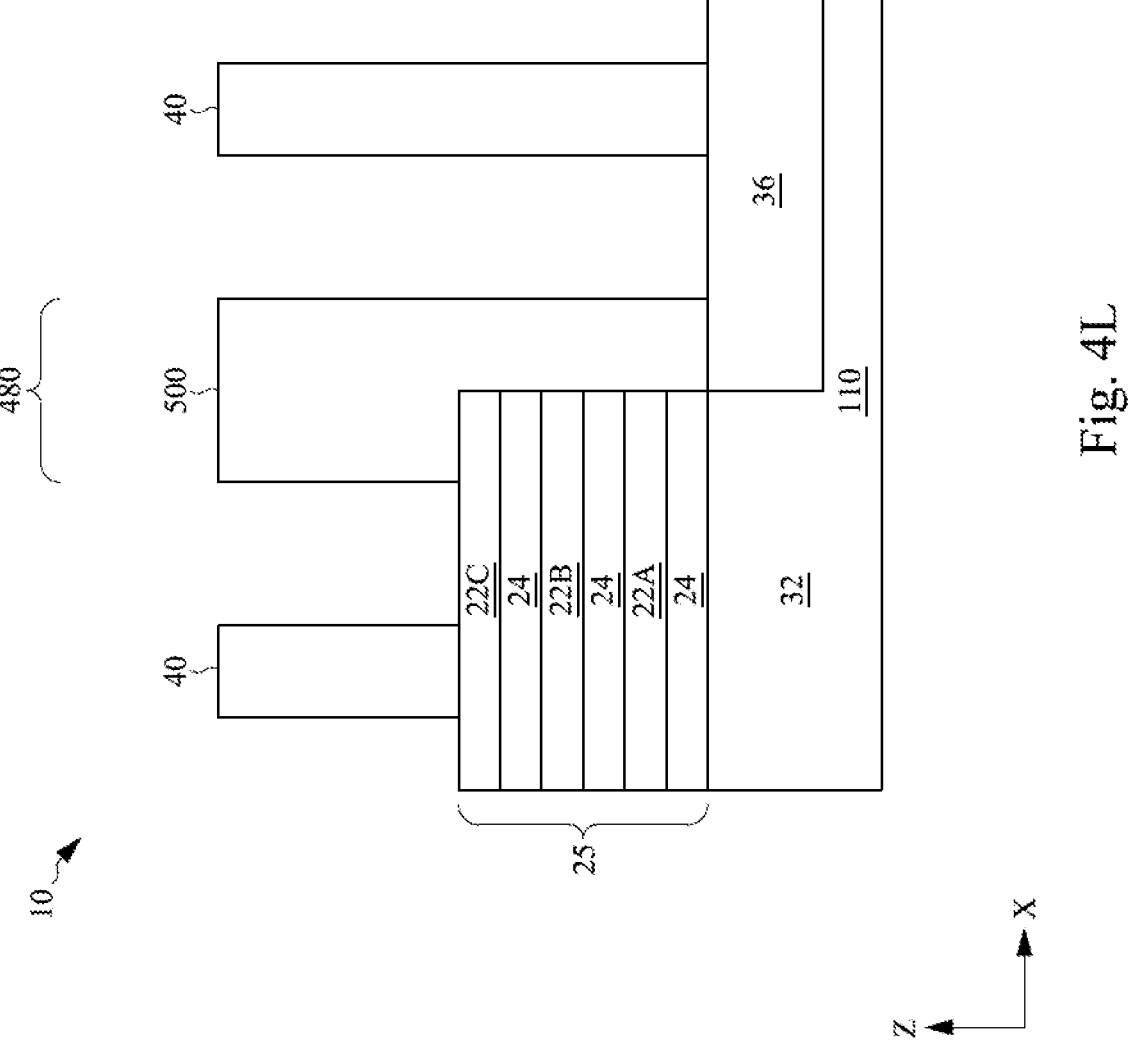
Figure 4M:
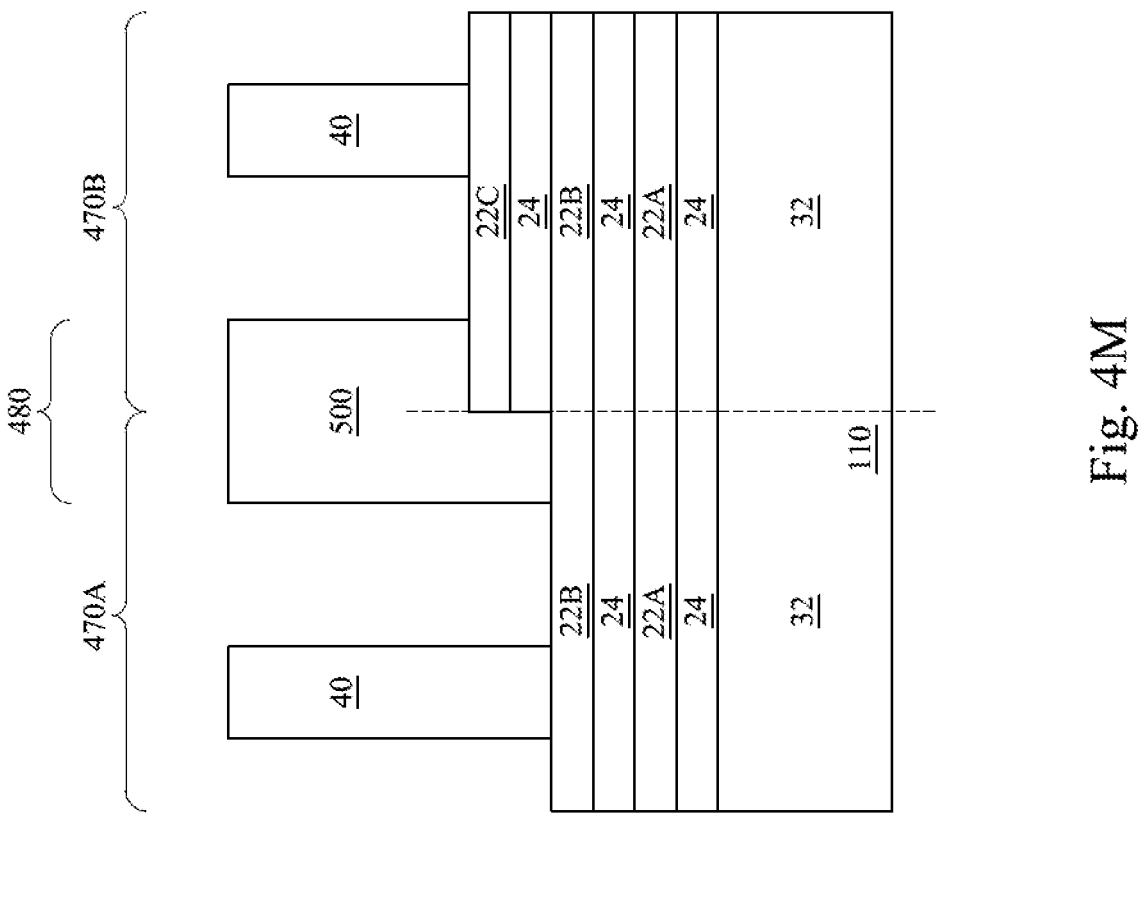
Figure 4N:
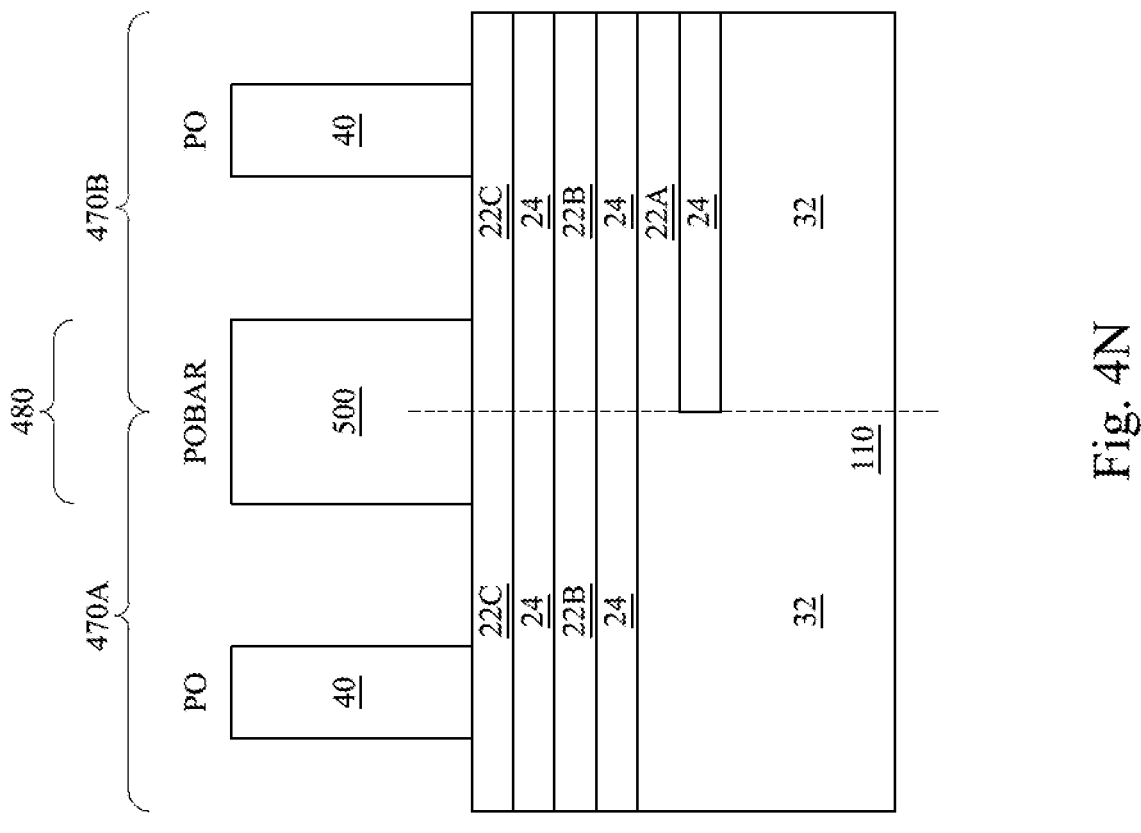

FIGS. 4L-4N are diagrammatic cross-sectional side views of a portion of the IC device 10 in accordance with various embodiments. The view of FIGS. 4L-4N depict position of a POBAR 500 (e.g., the POBAR 500C, 500D, 500S or 500M) along the cross-sectional lines I-I and II-II of FIG. 4I. FIGS. 4M and 4N depict hybrid sheet devices in which the IC device 10 includes one or more first transistors having a first number of sheets 22 (e.g., two) and one or more second transistors having a second number of sheets 22 (e.g., three).

FIG. 4L depicts a portion of the IC device 10 along the cross-sectional line II-II of FIG. 4I. Referring to FIG. 4L and FIG. 4I, the stacks 25 of nanosheets 22, 24 are present in the ODs 820N, 820P and the ODs 820N, 820P are separated by the isolation regions 36 (e.g., STIs). The POBAR 500 extends over the ODs 820N, 820P including the stacks 25, and over the stacks 25 of nanosheets 22, 24. As such, the POBAR 500 may have portions that are on the uppermost sheets 22C of the stacks 25 and other portions that are on the isolation regions 36. For example, the POBAR 500 may be in direct contact with an upper surface of the isolation region 36 and may also be in direct contact with an upper surface of the sheet 22C. In some embodiments in which the dummy gate dielectric 43 is formed, the POBAR 500 may be in direct contact with the dummy gate dielectric 43 instead of with the upper surface of the sheet 22C.

FIG. 4M depicts a portion of the IC device 10 along the cross-sectional line I-I of FIG. 4I. In some embodiments, the IC device 10 includes a first region 470A including two channels 22A, 22B and a second region 470B including three channels 22A, 22B, 22C. Namely, devices (e.g., transistors) in the first region 470A have fewer nanosheet channels than devices in the second region 470B. The POBAR 500 may be positioned at an interface of the first region 470A and the second region 470B. As such, a portion of the POBAR 500 over the first region 470A may extend to a second depth that is deeper than a first depth that a portion of the POBAR 500 overlying the second region 470B extends to. The POBAR 500 may have a portion overlying the isolation region 36 that extends to a third depth that is deeper than the first and second depths.

FIG. 4N depicts a portion of the IC device 10 along the cross-sectional line I-I of FIG. 4I. In some embodiments, the IC device 10 includes a first region 470A including two channels 22A, 22B and a second region 470B including three channels 22A, 22B, 22C. Different from the embodiment depicted in FIG. 4M, the first region 470A may include the channels 22B, 22C instead of the channels 22A, 22B. The POBAR 500 may be positioned at an interface of the first region 470A and the second region 470B. As such, the POBAR 500 may extend to the same depth (e.g., the first depth) over the first region 470A and the second region 470B. The POBAR 500 may have a portion overlying the isolation region 36 that extends to the third depth that is deeper than the first depth.

Figure 5:
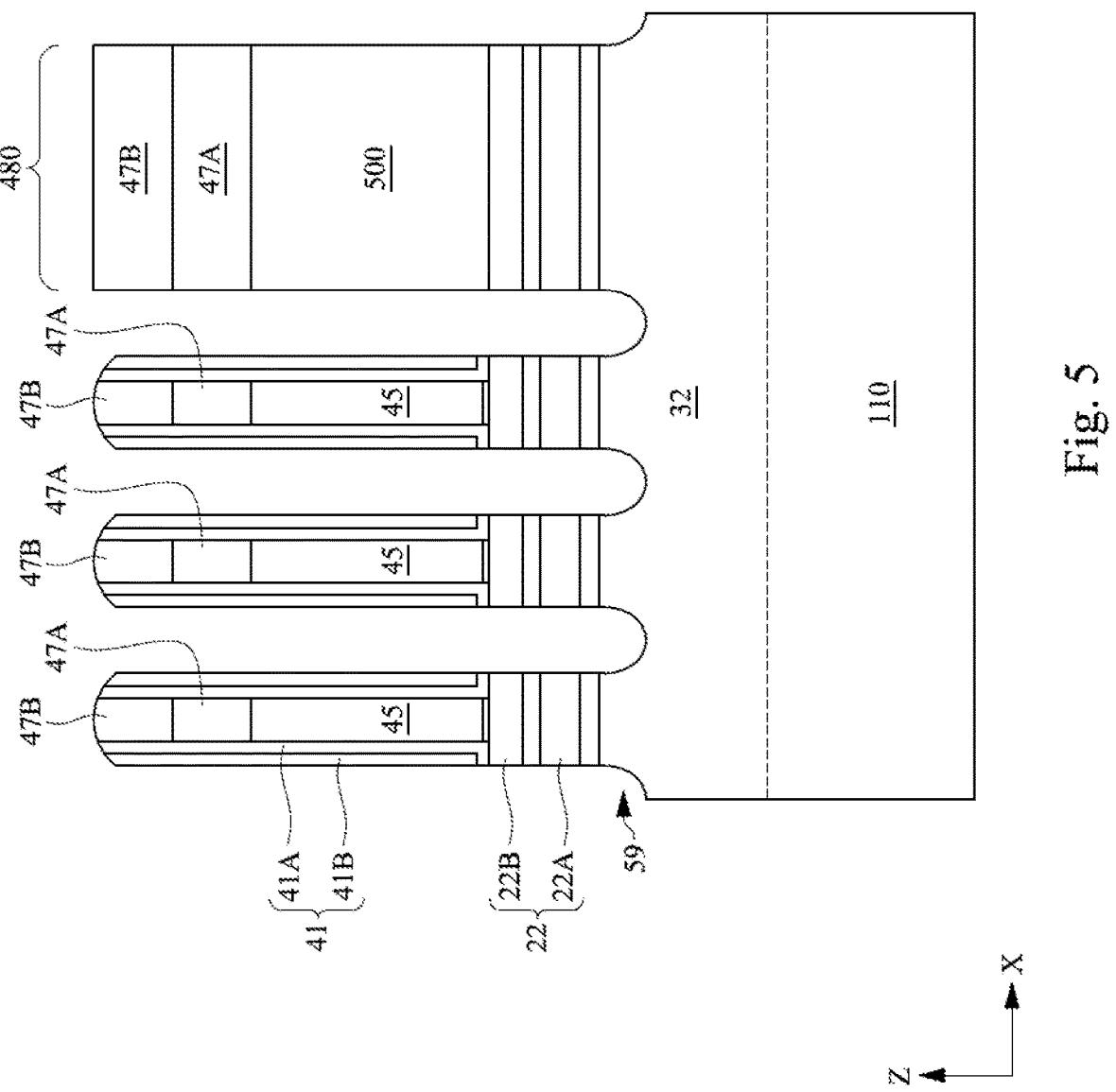

In FIG. 5, an etching process is performed to etch the portions of protruding fins 32 and/or nanostructures 22, 24 that are not covered by dummy gate structures 40 or the POBAR 500, resulting in the structure shown. The recessing may be anisotropic, such that the portions of fins 32 directly underlying dummy gate structures 40 and the spacer layer 41 are protected and are not etched. The top surfaces of the recessed fins 32 may be substantially coplanar with the top surfaces of the isolation regions 36, in accordance with some embodiments. The top surfaces of the recessed fins 32 may be lower than the top surfaces of the isolation regions 36, in accordance with some other embodiments. FIG. 5 shows three vertical stacks of nanostructures 22, 24 for active devices and a vertical stack under the POBAR 500 following the etching process for simplicity. In general, the etching process may be used to form any number of vertical stacks of nanostructures 22, 24 over the fins 32. Similarly, any number of POBARs 500 may be formed over the fins 32. In some embodiments, the second mask layer 47B is exposed following the etching process, for example, due to removal of upper portions of the spacer layers 41A, 41B during the etching process. In some embodiments, as shown, the POBAR 500 may be covered by the first and second mask layers 47A, 47B, however the spacer layers 41 may not be formed over the POBAR 500.

Figure 6:
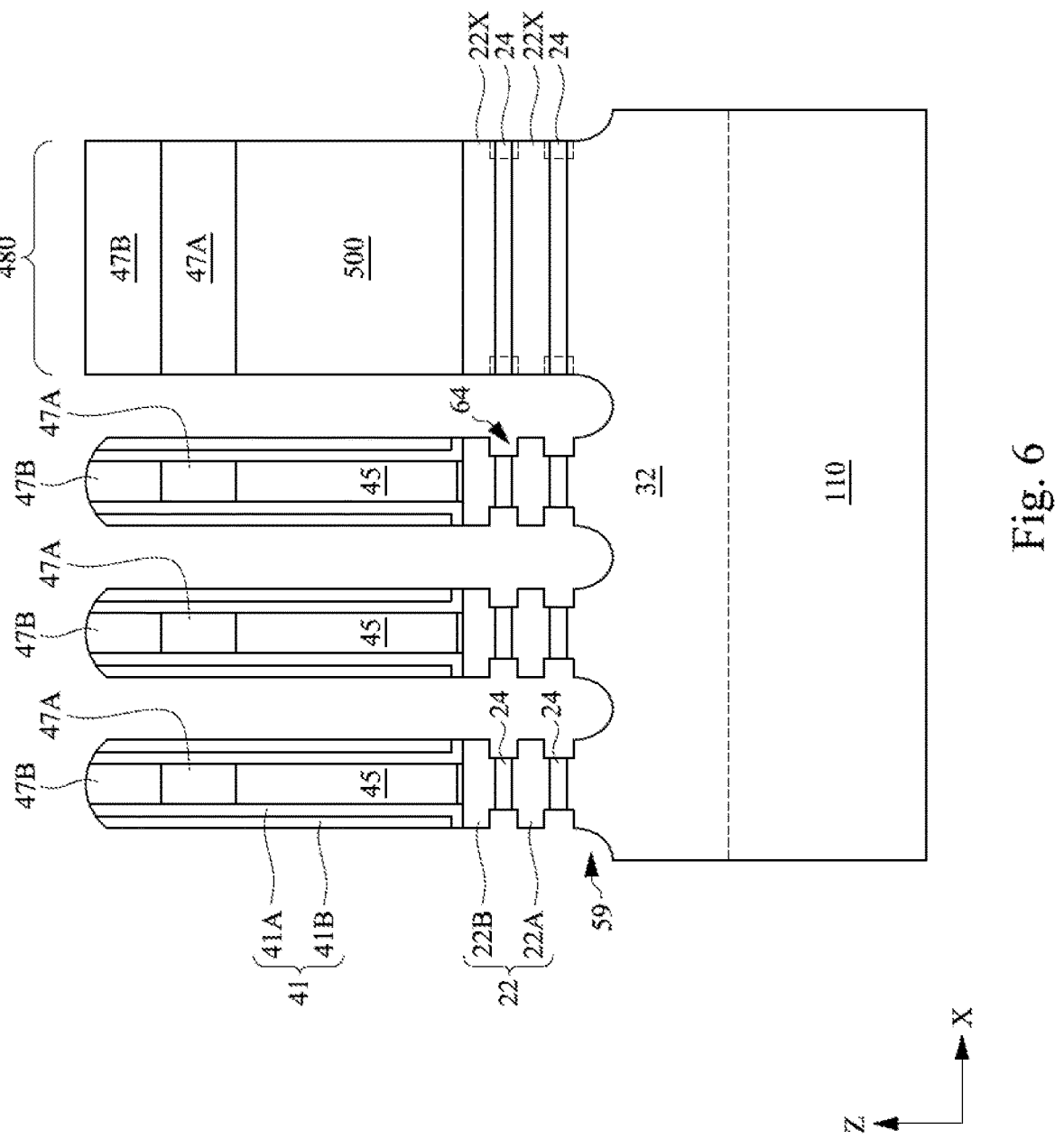
Figure 7:
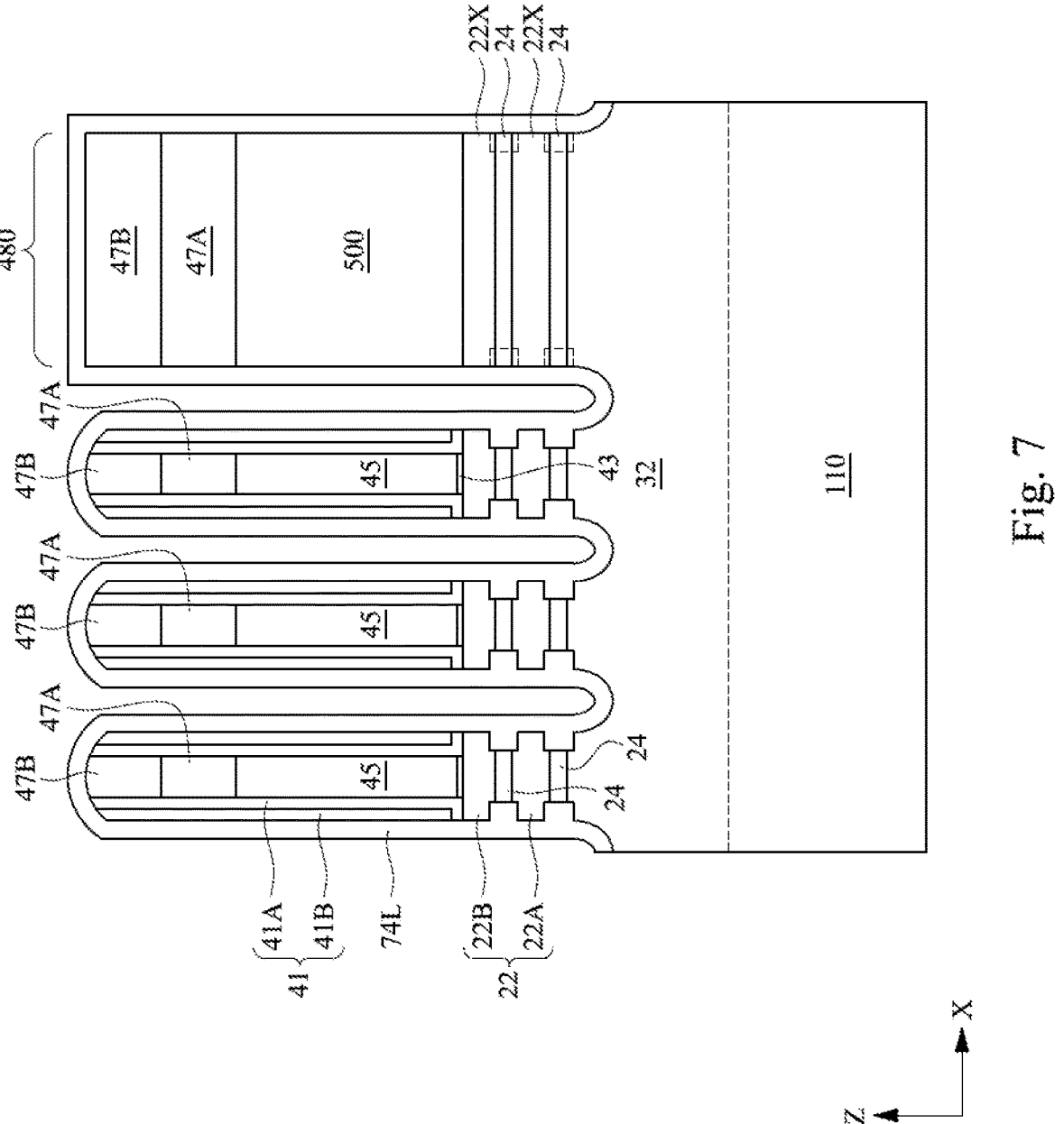
Figure 8:
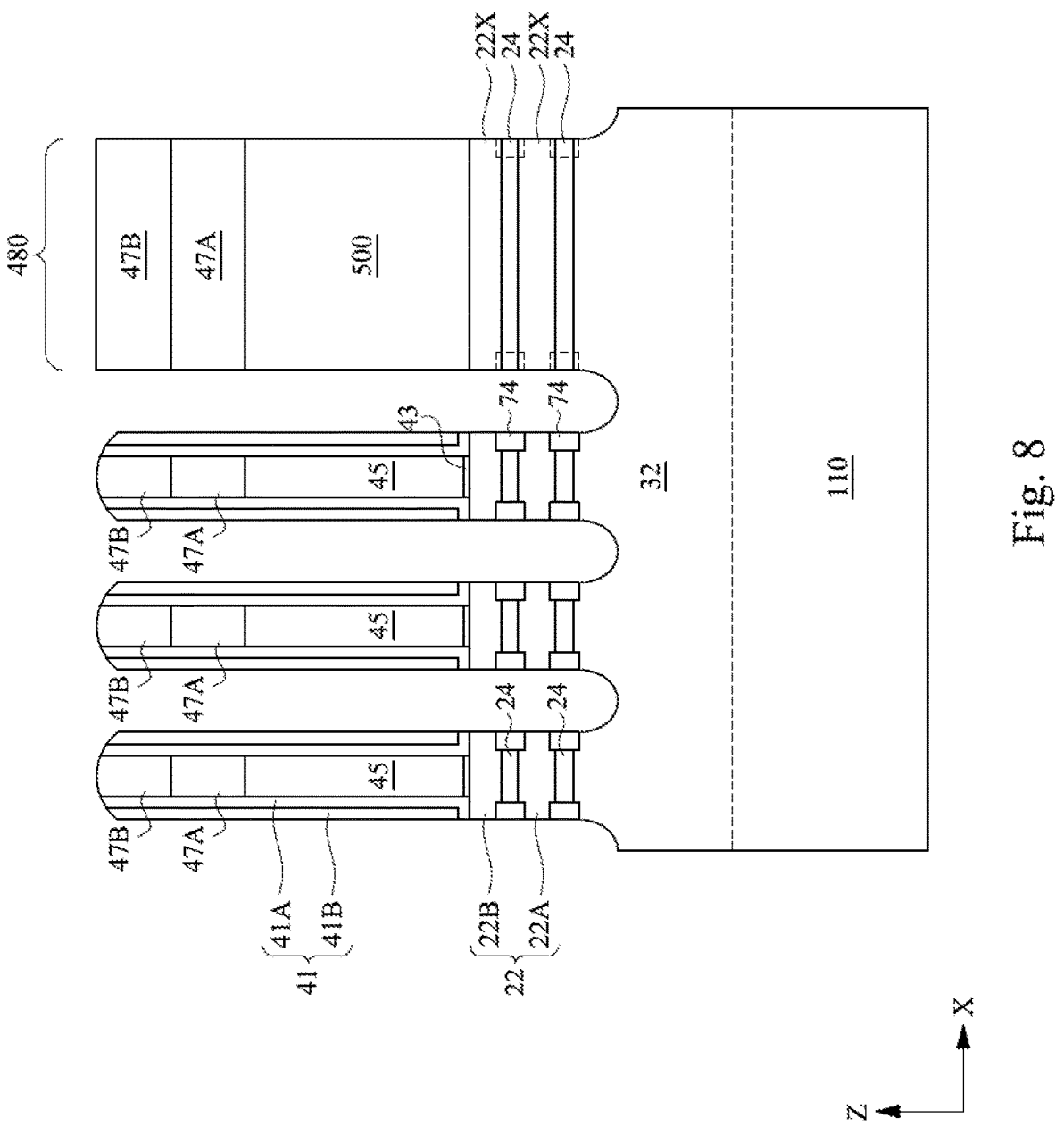

FIGS. 6-8 illustrate formation of inner spacers 74, corresponding to act 1400 of FIG. 14.

In FIG. 6, a selective etching process is performed to recess end portions of the nanostructures 24 exposed by openings in the spacer layer 41 without substantially attacking the nanostructures 22, corresponding to act 1400 of FIG. 14. After the selective etching process, recesses 64 are formed in the nanostructures 24 at locations where the removed end portions used to be. The resulting structure is shown in FIG. 6. In the embodiment depicted in FIG. 6, end portions of the nanostructures 24 underlying the POBAR 500 are not recessed. In some embodiments, the end portions of the nanostructures 24 underlying the POBAR 500 are recessed (depicted in phantom), which may reduce number of masks and lithography operations performed when forming the IC device 10. Channels 22X underlying the POBAR 500 may be referred to as inactive channels 22X. The inactive channels 22X are not part of active devices, such as nanostructure FETs or capacitors.

In FIG. 7, following formation of the recesses 64, an inner spacer layer 74L is formed to fill the recesses 64 in the nanostructures 22 formed by the previous selective etching process. The inner spacer layer 74L may be a suitable dielectric material, such as silicon carbon nitride (SiCN), silicon oxycarbonitride (SiOCN), or the like, formed by a suitable deposition method such as PVD, CVD, ALD, or the like.

In FIG. 8, the inner spacers 74 are formed, corresponding to act 1400 of FIG. 14. An etching process, such as an anisotropic etching process, is performed to remove portions of the inner spacer layer 74 disposed outside the recesses 64, for example, on sidewalls of the nanostructures 22 and the fins 32. The remaining portions of the inner spacer layer 74L (e.g., portions disposed inside the recesses 64 in the nanostructures 24) form the inner spacers 74. The resulting structure is shown in FIG. 8.

Figure 9A:
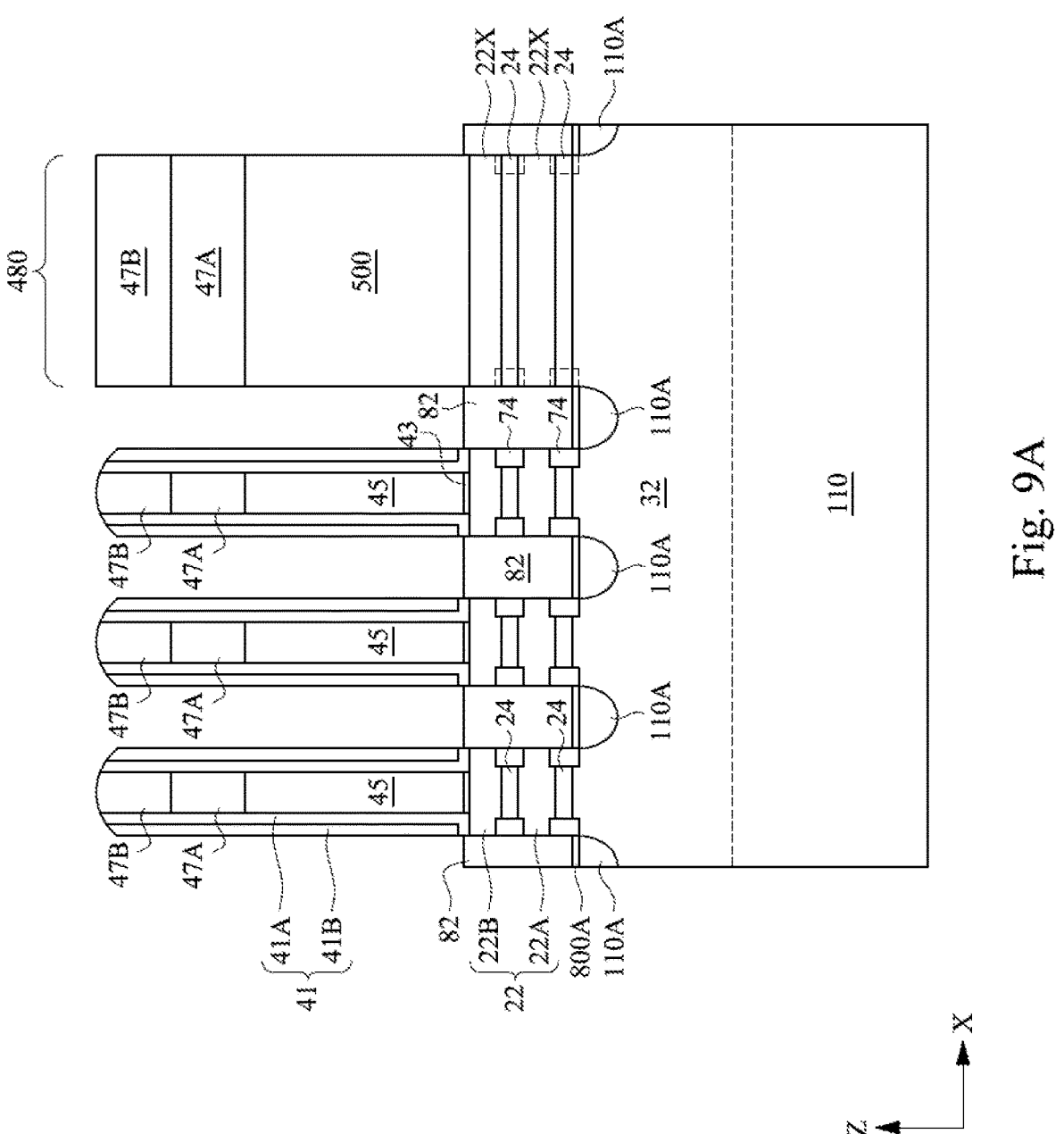
Figure 9B:
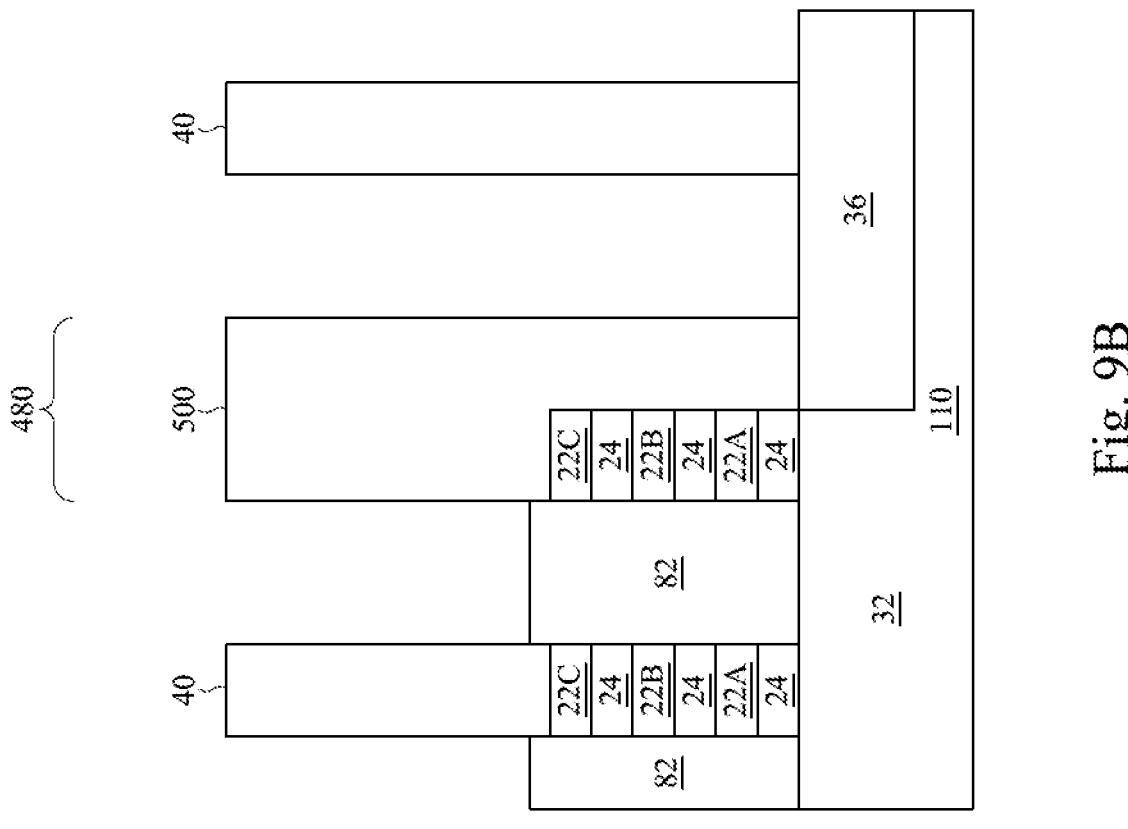
Figure 9C:
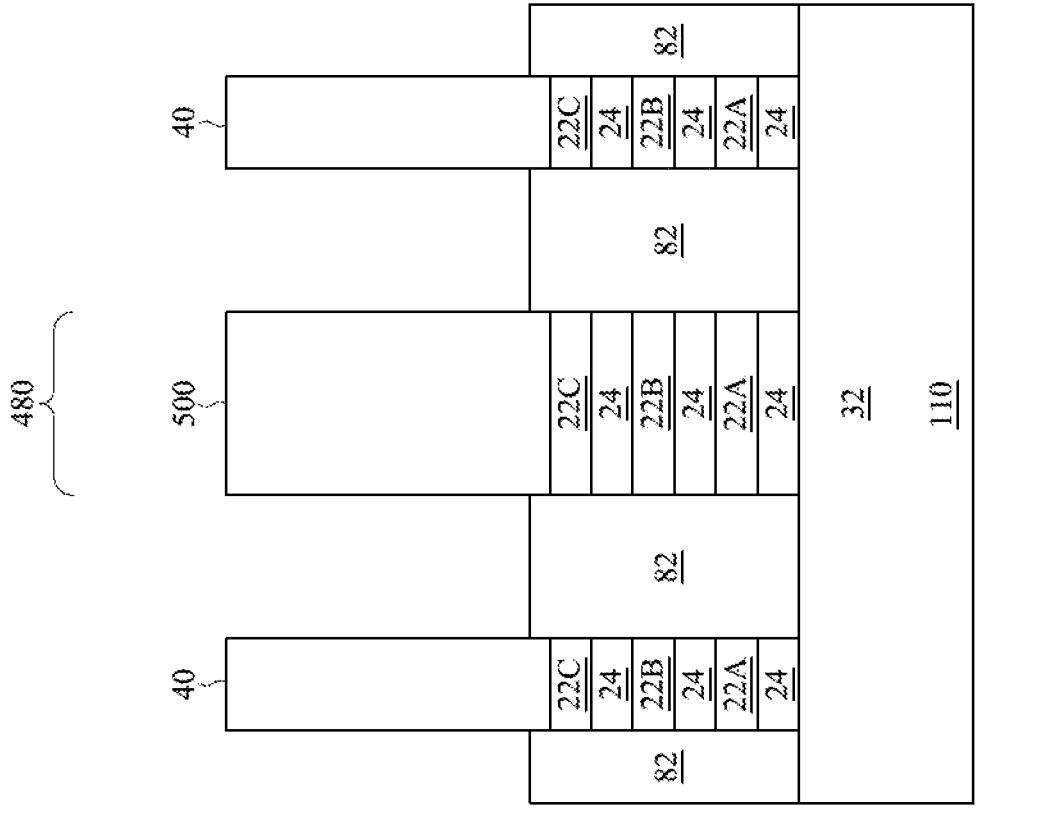

In FIGS. 9A-9C, following formation of the inner spacers 74, source/drain regions 82 are formed, corresponding to act 1500 of FIG. 14. In the illustrated embodiment, the source/drain regions 82 are epitaxially grown from epitaxial material(s). In some embodiments, the source/drain regions 82 exert stress in the respective channels 22A, 22B, thereby improving performance. The source/drain regions 82 are formed such that each dummy gate structure 40 is disposed between respective neighboring pairs of the source/drain regions 82. In some embodiments, the spacer layer 41 separates the source/drain regions 82 from the dummy gate layer 45 by an appropriate lateral distance to prevent electrical bridging to subsequently formed gates of the resulting device.

The source/drain regions 82 may be or include SiP, SiAs, SiSb, SiPAs, SiP:As:Sb or the like. In some embodiments, the source/drain regions 82 may be or include SiGe:B, SiGe:B:Ga, SiGe:Sn, SiGe:B:Sn or the like. The source/drain regions 82 may exert a compressive strain in the channel regions. The source/drain regions 82 may have surfaces raised from respective surfaces of the fins and may have facets. Neighboring source/drain regions 82 may merge in some embodiments to form a singular source/drain region 82 adjacent two neighboring fins 32.

In some embodiments, prior to forming the source/drain regions 82, undoped silicon layers 110A are formed in the source/drain openings, for example, to a level that is substantially coplanar with the upper surface of the fin 32. In some embodiments, a bottom dielectric or flexible bottom insulator (FBI) 800A is formed on the undoped silicon layers 110A prior to forming the source/drain regions 82. The FBI 800A can be beneficial to improving compressive or tensile strain in the channels 22 due to the source/drain regions 82 growing from the channels 22 without substantially growing from the undoped silicon layers 110A.

FIG. 9B depicts a simplified diagrammatic cross-sectional side view along the cross-sectional line II-II of FIG. 4I, and FIG. 9C depicts a diagrammatic cross-sectional side view along the cross-sectional line I-I of FIG. 4I. Certain elements are omitted from view in FIGS. 9B and 9C for simplicity of illustration. As shown in FIG. 9B, no source/drain region 82 is formed over the isolation region 36. It should also be noted that, due to presence of the POBAR 500, no source/drain region 82 is formed in the transition region 480. This is beneficial to preventing EPI defect noise in the IC device 10.

In FIGS. 10A-12C, following formation of the source/drain regions 82, active or replacement gate structures 200 may be formed that wrap around and cover the channels 22, corresponding to act 1600. Formation of the gate structures 200 may include releasing the channels 22 (FIGS. 10A-10C) and depositing materials of the gate structures 200 in openings formed during the releasing the channels 22 (FIGS. 11A-11C). An interlayer dielectric (ILD) 130 and an etch stop layer (ESL) 131 are omitted from view in FIGS. 10A and 11A so as not to obstruct view of other elements.

Figure 10B:
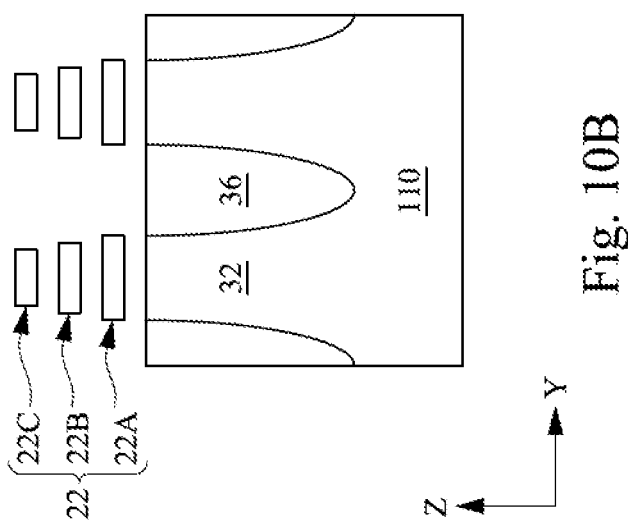
Figure 10A:
Figure 10A:
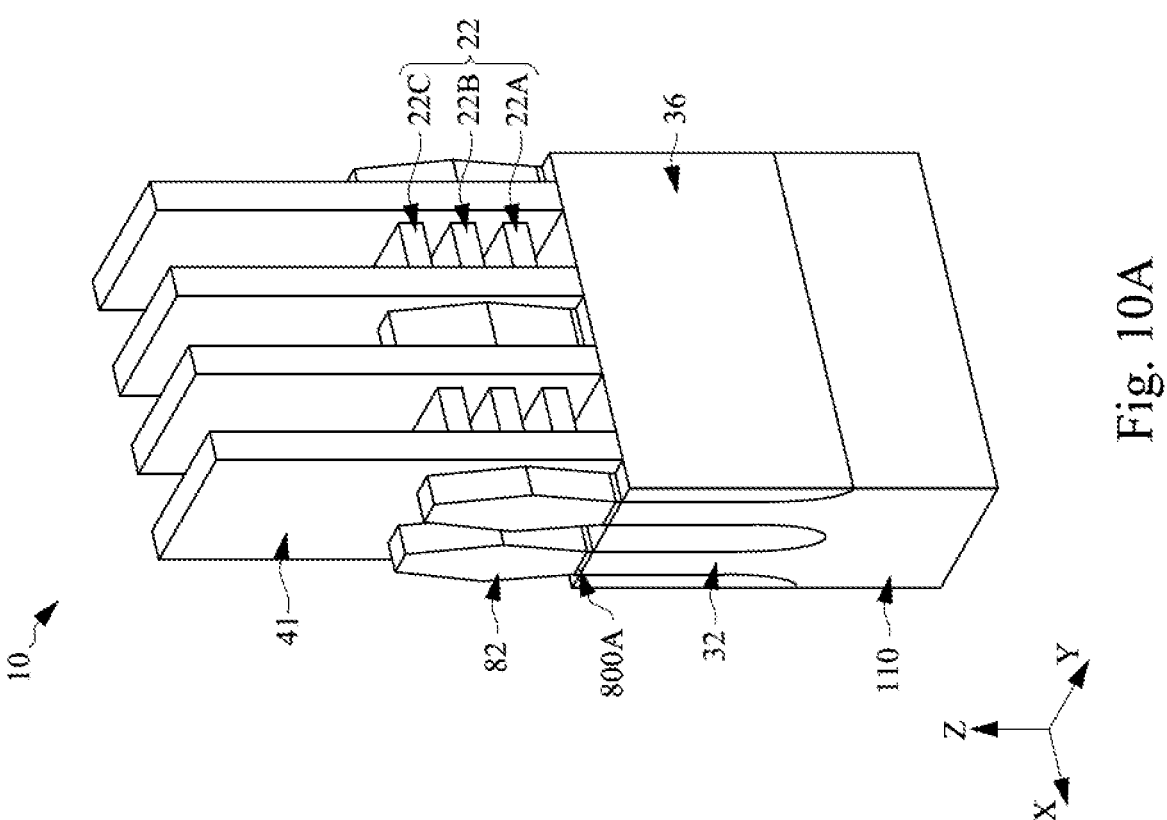
Figure 10C:
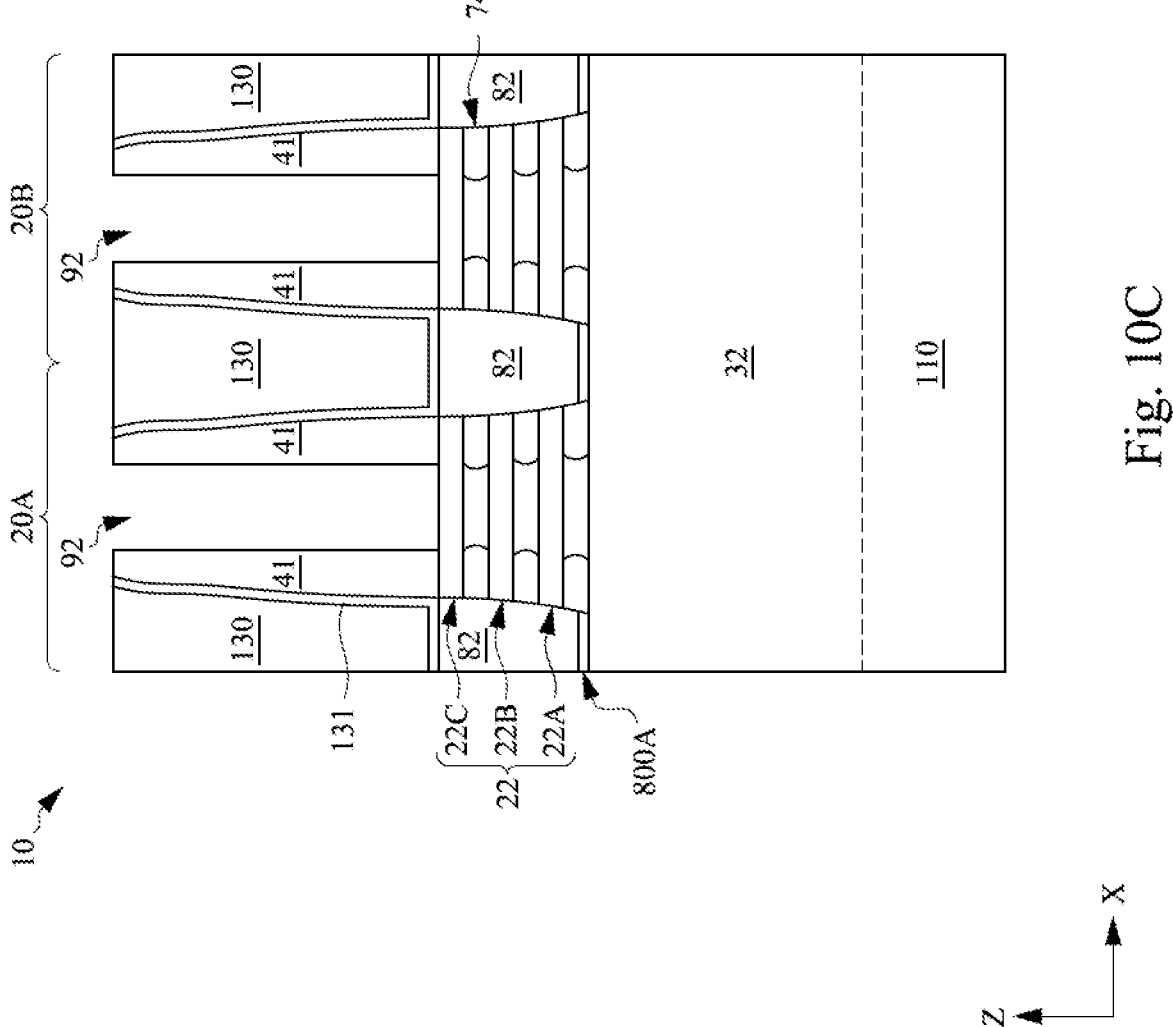

Prior to releasing the channels 22 and following formation of the source/drain regions 82, the ILD 130 may be formed covering the source/drain regions 82 and abutting the gate spacers 41, which is depicted in FIG. 10C. In some embodiments, the ESL 131 is formed prior to forming the ILD 130. The ESL 131 may be formed by depositing a conformal thin layer of a dielectric material different from that of the ILD 130, such as one or more of SiN, SiCN, SiC, SiOC, SiOCN, $HfO_2$, $ZrO_2$, $ZrAlO_x$, $HfAlO_x$, $HfSiO_x$, $Al_2O_3$, or other suitable material. Following deposition of the ESL 131, the ILD 130 may be deposited by a suitable process, such as a blanket deposition process, including PVD, CVD, ALD, or the like. The material of the ILD 130 may include silicon dioxide or a low-k dielectric material (e.g., a material having a dielectric constant (k-value) lower than the k-value (about 3.9) of silicon dioxide). The low-k dielectric material may include silicon oxynitride, phosphosilicate glass (PSG), borosilicate glass (BSG), borophosphosilicate glass (BPSG), undoped silicate glass (USG), fluorinated silicate glass (FSG), silicon oxycarbide (SiOxCy), Spin-On-Glass (SOG) or a combination thereof. The ILD 130 may be deposited by spin-on coating, CVD, Flowable CVD (FCVD), PECVD, PVD, or another deposition process.

In FIGS. 10A-10C, a planarization process, such as a chemical mechanical polishing (CMP) process, is performed on the ILD 130 and the ESL 131, which also removes the hard masks 47A, 47B and portions of the gate spacers 41. After the planarization process, the dummy gate layers 45 are exposed. The top surfaces of the ILD 130 and the ESL 131 may be coplanar with the top surfaces of the dummy gate layers 45 and the gate spacers 41.

Next, the dummy gate layer 45 is removed in an etching process, so that recesses are formed. In some embodiments, the dummy gate layer 45 is removed by an anisotropic dry etch process. For example, the etching process may include a dry etch process using reaction gas(es) that selectively etch the dummy gate layer 45 without etching the gate spacers 41. The dummy gate dielectric 43, when present, may be used as an etch stop layer when the dummy gate layer 45 is etched. The dummy gate dielectric 43 may then be removed after the removal of the dummy gate layer 45.

The nanostructures 24 are removed to release the nanostructures 22. After the nanostructures 24 are removed, the nanostructures 22 form a plurality of nanosheets that extend horizontally (e.g., parallel to a major upper surface of the substrate 110). In some embodiments, the nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises $F_2$ and HF, and the carrier gas may be an inert gas such as Ar, He, $N_2$, combinations thereof, or the like.

In some embodiments, the nanostructures 24 are removed and the nanostructures 22 are patterned to form channel regions of both PFETs and NFETs. However, in some embodiments the nanostructures 24 may be removed and the nanostructures 22 may be patterned to form channel regions of NFETs, and nanostructures 22 may be removed and the nanostructures 24 may be patterned to form channel regions of PFETs. In some embodiments, the nanostructures 22 may be removed and the nanostructures 24 may be patterned to form channel regions of NFETs, and the nanostructures 24 may be removed and the nanostructures 22 may be patterned to form channel regions of PFETs. In some embodiments, the nanostructures 22 may be removed and the nanostructures 24 may be patterned to form channel regions of both PFETs and NFETs.

In some embodiments, the nanosheets 22 are reshaped (e.g. thinned) by a further etching process to improve gate fill window. The reshaping may be performed by an isotropic etching process selective to the nanosheets 22. After reshaping, the nanosheets 22 may exhibit the dog bone shape in which middle portions of the nanosheets 22 are thinner than peripheral portions of the nanosheets 22 along the X direction.

Figure 11B:
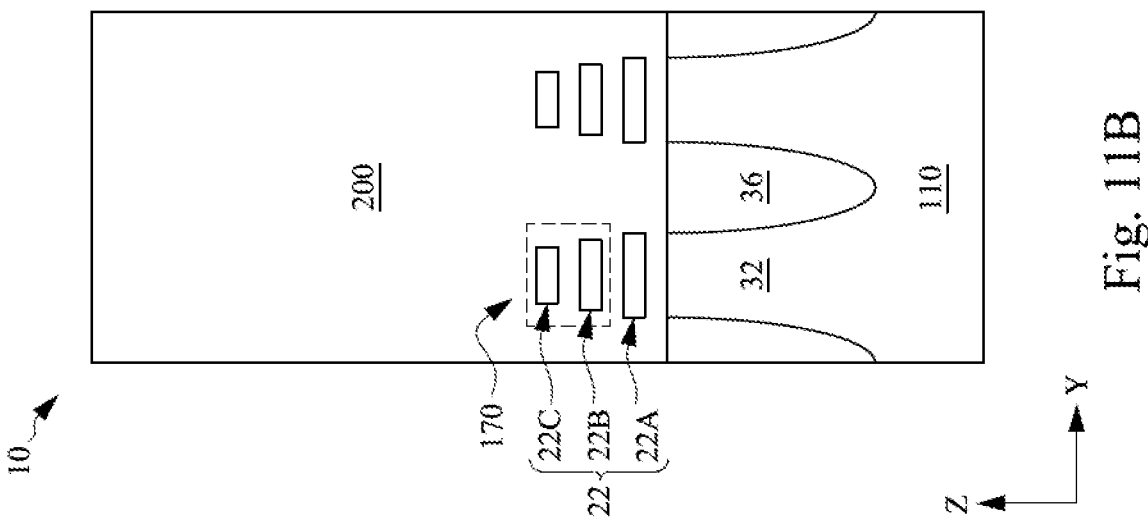
Figure 11A:
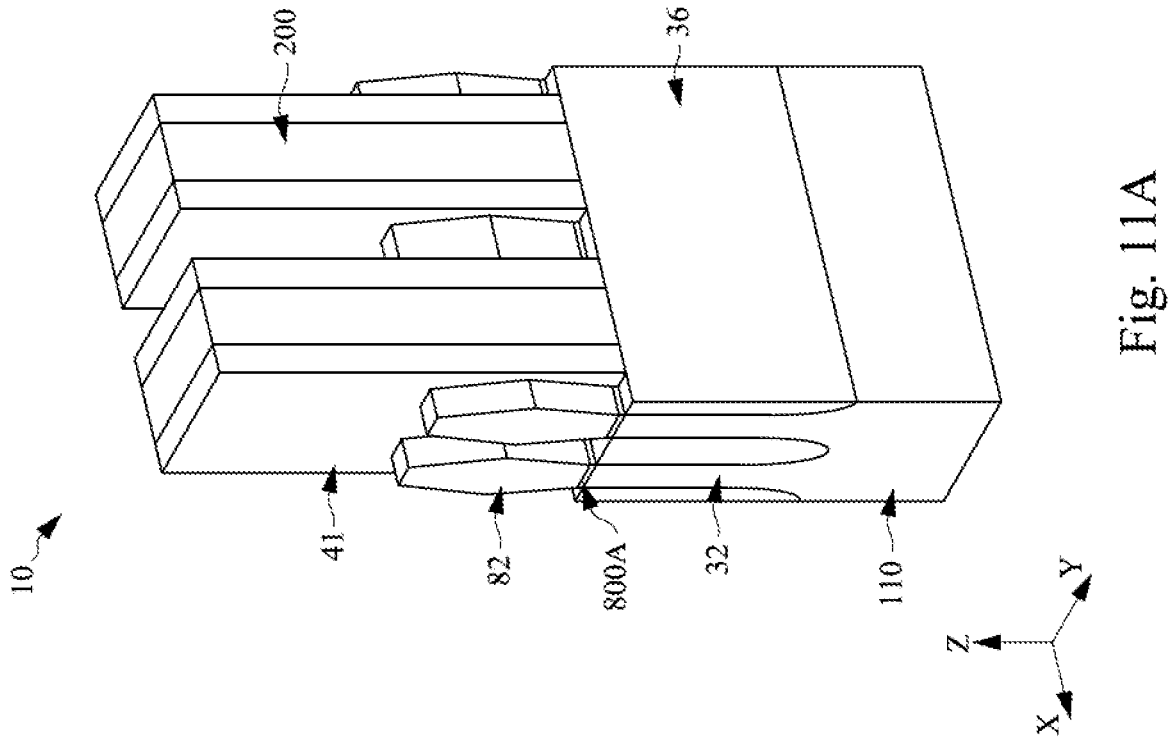
Figure 11C:
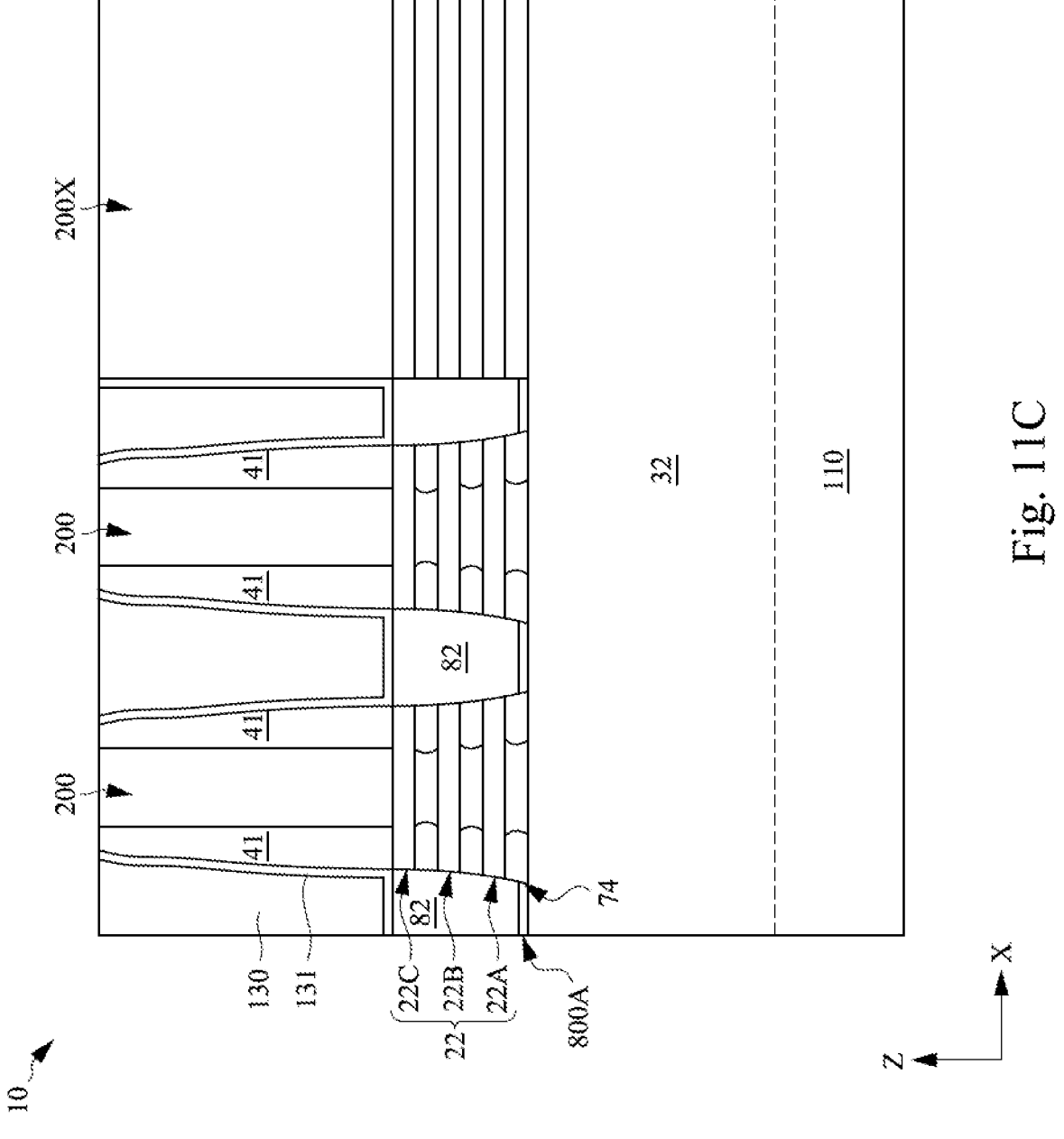

In FIGS. 11A-11C, replacement or active gates or "gate structures" 200 are formed. The gate structures 200 may be formed by a series of deposition operations, such as ALD cycles, that deposit the various layers of the gate structure 200 in the openings, described below with reference to FIG. 13.

FIG. 13 is a detailed view of a portion 170 of the gate structure 200 depicted in FIG. 11B. The gate structure 200 generally includes the interfacial layer (IL, or "first IL" below) 210, at least one gate dielectric layer 600, the work function metal layer 900, and the gate fill layer 290. In some embodiments, each replacement gate 200 further includes at least one of a second interfacial layer 240 or a second work function layer 700.

With reference to FIG. 13, in some embodiments, the first IL 210 includes an oxide of the semiconductor material of the substrate 110, e.g. silicon oxide. In other embodiments, the first IL 210 may include another suitable type of dielectric material. The first IL 210 has a thickness in a range between about 5 angstroms and about 50 angstroms.

Still referring to FIG. 13, the gate dielectric layer 600 is formed over the first IL 210. In some embodiments, an atomic layer deposition (ALD) process is used to form the gate dielectric layer 600 to control thickness of the deposited gate dielectric layer 600 with precision. In some embodiments, the ALD process is performed using between about 40 and 80 deposition cycles, at a temperature range between about 200 degrees Celsius and about 300 degrees Celsius. In some embodiments, the ALD process uses $HfCl_4$ and/or H₂O as precursors. Such an ALD process may form the gate
dielectric layer 600 to have a thickness in a range between
about 10 angstroms and about 100 angstroms.

In some embodiments, the gate dielectric layer 600
includes a high-k dielectric material, which may refer to
dielectric materials having a high dielectric constant that is
greater than a dielectric constant of silicon oxide (k≈3.9).
Exemplary high-k dielectric materials include HfO₂, HfSiO,
HfSiON, HfTaO, HfTiO, HfZrO, ZrO₂, Ta₂O₅, or combina-
tions thereof. In other embodiments, the gate dielectric layer
600 may include a non-high-k dielectric material such as
silicon oxide. In some embodiments, the gate dielectric layer
600 includes more than one high-k dielectric layer, of which
at least one includes dopants, such as lanthanum, magne-
sium, yttrium, or the like, which may be driven in by an
annealing process to modify threshold voltage of the nano-
structure device 20P.

With further reference to FIG. 13, a second IL 240 is
formed on the gate dielectric layer 600, and a work function
barrier layer 700 is formed on the second IL 240. The second
IL 240 promotes better metal gate adhesion on the gate
dielectric layer 600. In many embodiments, the second IL
240 further provides improved thermal stability for the gate
structure 200 and serves to limit diffusion of metallic impu-
rity from a work function metal layer 900 into the gate
dielectric layer 600. In some embodiments, formation of the
second IL 240 is accomplished by first depositing a high-k
capping layer (not illustrated for simplicity) on the gate
dielectric layer 600. The high-k capping layer comprises one
or more of the following: HfSiON, HfTaO, HfTiO, HfTaO,
HfAlON, HfZrO, or other suitable materials, in various
embodiments. In a specific embodiment, the high-k capping
layer comprises titanium silicon nitride (TiSiN). In some
embodiments, the high-k capping layer is deposited by an
ALD using about 40 to about 100 cycles at a temperature of
about 400 degrees C. to about 450 degrees C. A thermal
anneal is then performed to form the second IL 240, which
may be or comprise TiSiNO, in some embodiments. Fol-
lowing formation of the second IL 240 by thermal anneal, an
atomic layer etch (ALE) with artificial intelligence (AI)
control may be performed in cycles to remove the high-k
capping layer while substantially not removing the second
IL 240. Each cycle may include a first pulse of WCl₅,
followed by an Ar purge, followed by a second pulse of O₂,
followed by another Ar purge. The high-k capping layer is
removed to increase gate fill window for further multiple
threshold voltage tuning by metal gate patterning.

Further in FIG. 13, after forming the second IL 240 and
removing the high-k capping layer, the work function barrier
layer 700 is optionally formed on the gate structure 200, in
accordance with some embodiments. The work function
barrier layer 700 is or comprises a metal nitride, such as TiN,
WN, MoN, TaN, or the like. In a specific embodiment, the
work function barrier layer 700 is TiN. The work function
barrier layer 700 may have thickness ranging from about 5
A to about 20 A. Inclusion of the work function barrier layer
700 provides additional threshold voltage tuning flexibility.
In general, the work function barrier layer 700 increases the
threshold voltage for NFET transistor devices, and decreases
the threshold voltage (magnitude) for PFET transistor
devices.

The work function metal layer 900, which may include at
least one of an N-type work function metal layer, an in-situ
capping layer, or an oxygen blocking layer, is formed on the
work function barrier layer 700, in some embodiments. The
N-type work function metal layer is or comprises an N-type
metal material, such as TiAlC, TiAl, TaAlC, TaAl, or the like. The N-type work function metal layer may be formed
by one or more deposition methods, such as CVD, PVD,
ALD, plating, and/or other suitable methods, and has a
thickness between about 10 A and 20 A. The in-situ capping
layer is formed on the N-type work function metal layer. In
some embodiments, the in-situ capping layer is or comprises
TiN, TiSiN, TaN, or another suitable material, and has a
thickness between about 10 A and 20 A. The oxygen
blocking layer is formed on the in-situ capping layer to
prevent oxygen diffusion into the N-type work function
metal layer, which would cause an undesirable shift in the
threshold voltage. The oxygen blocking layer is formed of a
dielectric material that can stop oxygen from penetrating to
the N-type work function metal layer, and may protect the
N-type work function metal layer from further oxidation.
The oxygen blocking layer may include an oxide of silicon,
germanium, SiGe, or another suitable material. In some
embodiments, the oxygen blocking layer is formed using
ALD and has a thickness between about 10 A and about 20
A.

FIG. 13 further illustrates the metal core layer 290. In
some embodiments, a glue layer (not separately illustrated)
is formed between the oxygen blocking layer of the work
function metal layer 900 and the metal core layer 290. The
glue layer may promote and/or enhance the adhesion
between the metal core layer 290 and the work function
metal layer 900. In some embodiments, the glue layer may
be formed of a metal nitride, such as TiN, TaN, MoN, WN,
or another suitable material, using ALD. In some embodi-
ments, thickness of the glue layer is between about 10 A and
about 25 A. The metal core layer 290 may be formed on the
glue layer, and may include a conductive material such as
tungsten, cobalt, ruthenium, iridium, molybdenum, copper,
aluminum, or combinations thereof. In some embodiments,
the metal core layer 290 may be deposited using methods
such as CVD, PVD, plating, and/or other suitable processes.
In some embodiments, a seam 510, which may be an air gap,
is formed in the metal core layer 290 vertically between the
channels 22A, 22B. In some embodiments, the metal core
layer 290 is conformally deposited on the work function
metal layer 900. The seam 510 may form due to sidewall
deposited film merging during the conformal deposition. In
some embodiments, the seam 510 is not present between the
neighboring channels 22A, 22B.

As shown in FIG. 11C, an inactive gate structure 200X
may be formed in the transition region 480 after removal of
the POBAR 500. The inactive gate structure 200X may have
substantially the same number and composition of layers as
the gate structure 200 just described or may have fewer
layers than the gate structure 200 to simplify removal
thereof in subsequent operations.

Figure 12A:
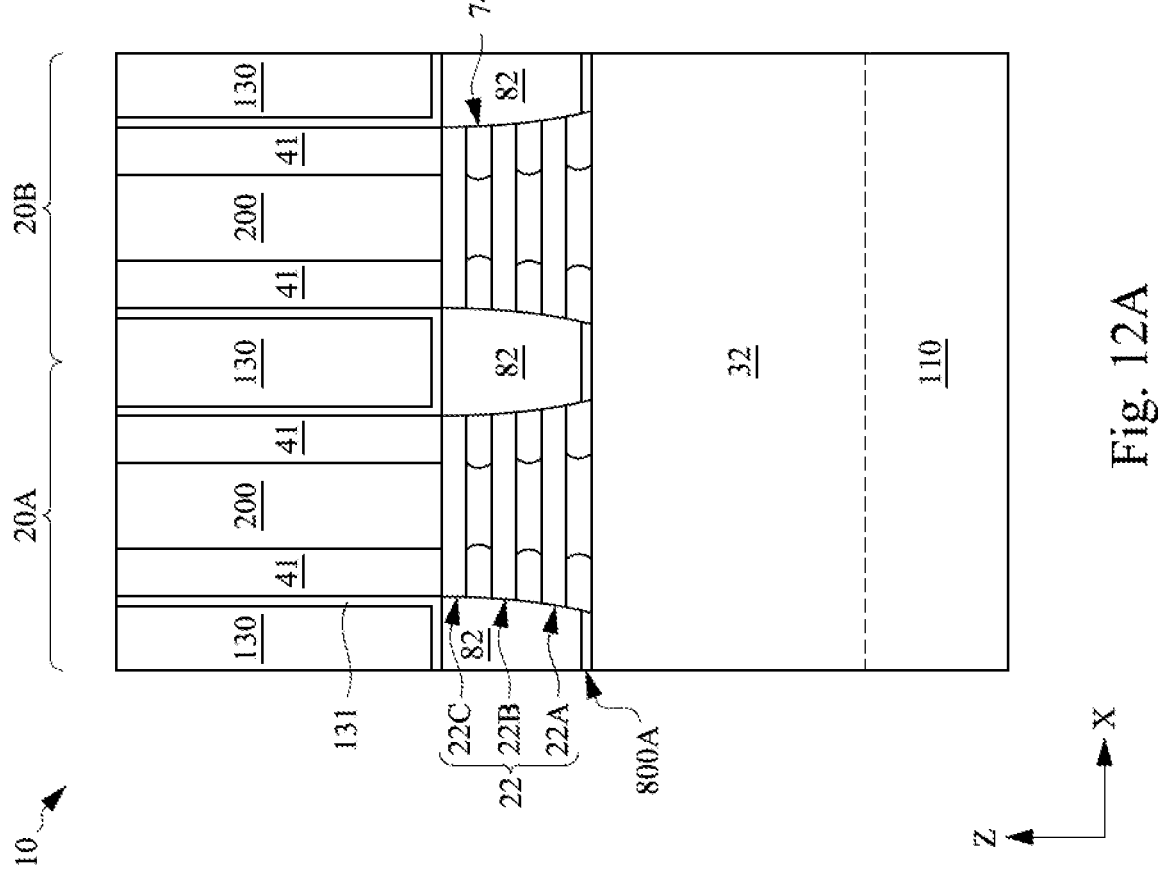
Figures 12B, 12C:
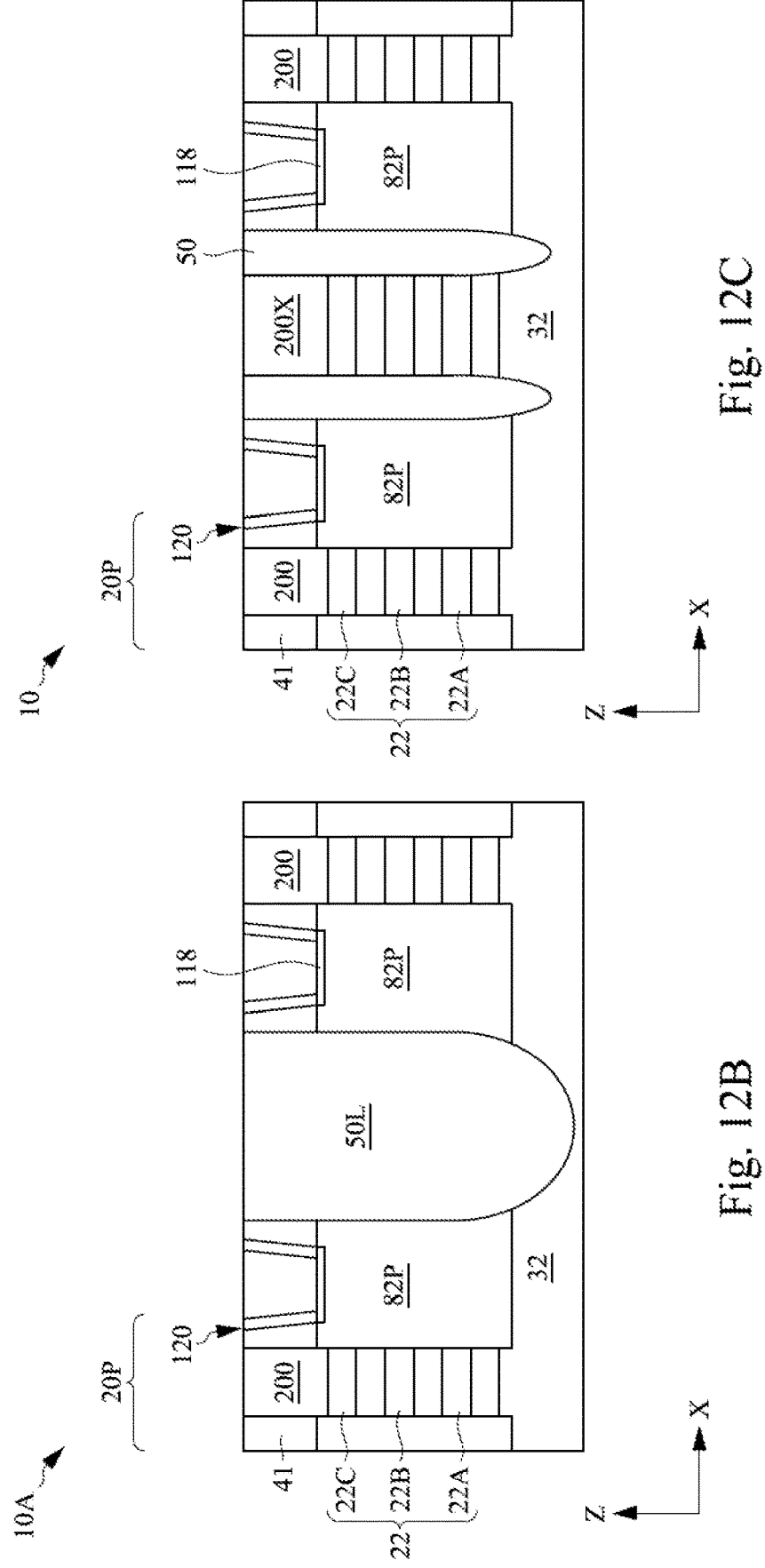

In FIGS. 12B and 12C, following formation of the gate
structures 200 and the inactive gate structure 200X, isolation
structures 50, 50L and source/drain contacts 120 may be
formed. FIG. 12B depicts the IC device 10A which includes
isolation structure 50L. FIG. 12C depicts the IC device 10
which includes isolation structures 50.

In FIG. 12B, the isolation structure 50L may be formed by
removing the inactive gate structure 200X entirely. Removal
of the inactive gate structure 200X may include one or more
removal operations. For example, an opening may be
formed by performing one or more chemical etches that
sequentially remove the metal core layer 290, the work
function layers 700, 900 and the gate dielectric 600. Fol-
lowing removal of the inactive gate structure 200X, the
channels 22 may be removed by a suitable etching operation.
In some embodiments, a portion of the fin 32 underlying the inactive gate structure 200X is removed, as depicted in FIG. 12B. Following formation of the opening, the isolation structure 50L is formed in the opening. The isolation structure 50L may extend from the fin 32 to a level coplanar with upper surfaces of the gate structures 200, gate spacers 41 and source/drain contacts 120. The isolation structure 50L, in some embodiments, may be or include SiN or another suitable dielectric material, and may be formed by a suitable deposition operation, such as a PVD, CVD or ALD. The isolation structure 50L may also be referred to as a continuous poly on diffusion edge (CPODE) or a diffusion break. In some embodiments, the isolation structure 50L is separated from the gate structure 200 and stack of channels 22 on either side thereof by a first distance. In some embodiments, the first distance is equal to the width of the respective source/drain region 82P in the X-axis direction.

Figures 12D, 12E:
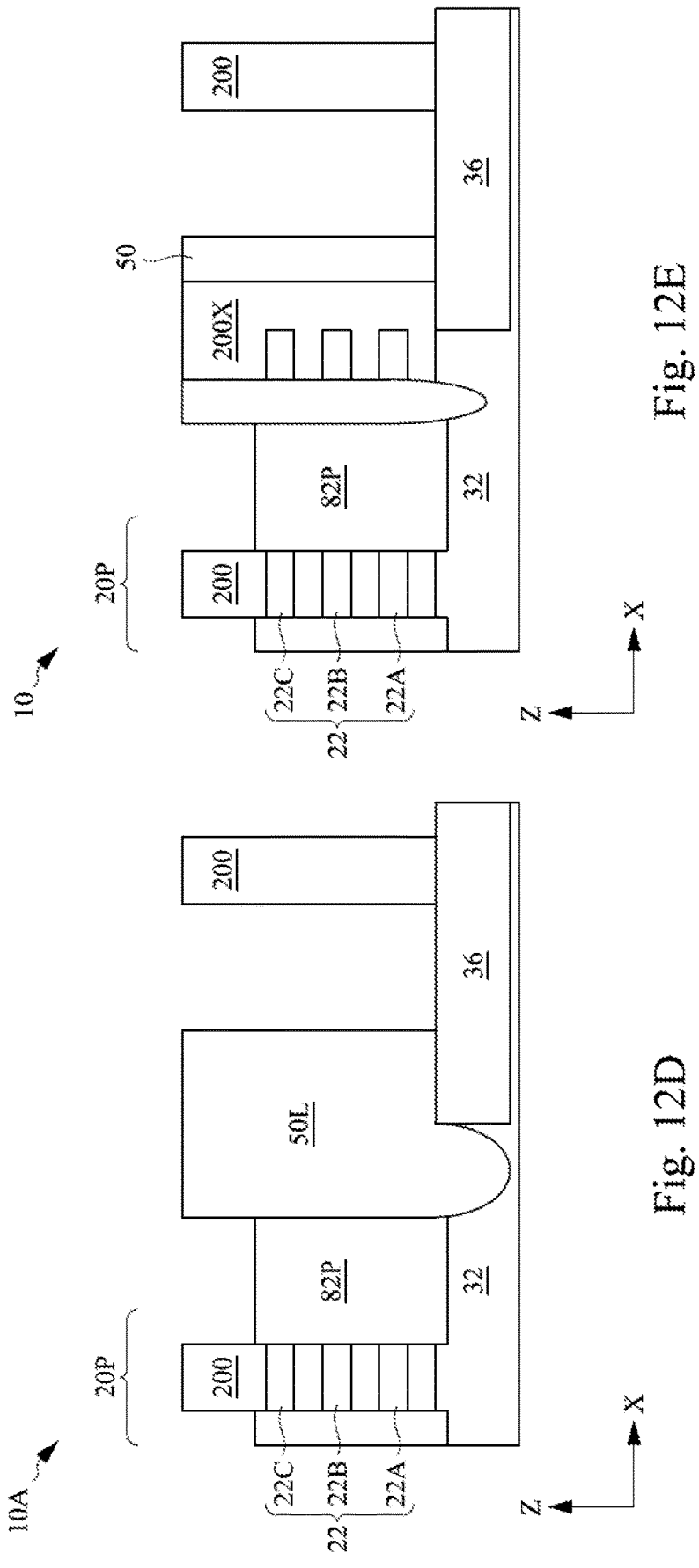

FIG. 12D depicts a cross-sectional view through the isolation region 36. As shown, the isolation structure 50L lands on the isolation region 36 but does not extend substantially into the isolation region 36. The isolation structure 50L may have a sidewall that is in direct contact with a sidewall of the isolation region 36 and may extend to a level that is below a bottom surface of the isolation region 36.

In FIG. 12C, instead of removing the inactive gate structure 200X entirely, portions of the inactive gate structure 200X are removed and replaced with the isolation structures 50. The isolation structures 50 may be similar in most respects (e.g., material composition) to the isolation structure 50L. When forming the isolation structures 50, for example, portions of the inactive gate structure 200X that would have been overlapped by regularly-spaced sacrificial gates 40 if present may be removed. Namely, outer or side portions of the inactive gate structure 200X may be removed, and the outer portions may have width in the X-axis direction that is substantially equal to one sacrificial gate width. In some embodiments, the outer portions of the inactive gate structure 200X that are removed have width that is less than one sacrificial gate width. In some embodiments, the outer portions have width that exceeds one sacrificial gate width. In the embodiment of FIG. 12C, the isolation structures 50 and the inactive gate structure 200X may be referred to collectively as an "isolation structure."

Openings may be formed by removing the outer portions of the inactive gate structure 200X. Removal of the outer portions may be similar to that described with reference to FIG. 12B. Following formation of the openings, the isolation structures 50 may be formed in the openings. Formation of the isolation structures 50 may be similar to formation of the isolation structure 50L. The isolation structures 50 may extend into the fin 32, as depicted in FIGS. 12C and 12E. As shown in FIG. 12E, the isolation structures 50 may not substantially extend into the isolation region 36. For example, one or more of the isolation structures 50 may land on a respective isolation region 36 and may have a lower surface that is substantially coplanar with an upper surface of the isolation region 36. In some embodiments, an etching procedure that etches into the fin 32 when forming the opening may etch slightly into the isolation region 36, such that the isolation structure 50 may extend slightly into the fin 32. Generally, however, the isolation structure 50 extends further into the fin 32 than into the isolation region 36.

Following formation of the isolation structure 50L or the isolation structures 50, source/drain openings may be formed in the ILD 130 and source/drain contacts 120 may be formed in the source/drain openings. The resulting structure is shown in FIGS. 12B and 12C. Silicide regions 118 and the source/drain contacts 120 are formed on the source/drain regions 82.

In some embodiments, the silicide layers 118 are formed prior to formation of the source/drain contacts 120. For example, an N-type or P-type metal layer may be formed as a conformal thin layer over exposed portions of the source/drain regions 82. The metal layer may be or include one or more of Ni, Co, Mn, W, Fe, Rh, Pd, Ru, Pt, Ir, Os or the like. In some embodiments, the metal layer is or includes one or more of Ti, Cr, Ta, Mo, Zr, Hf, Sc, Ys, Ho, Tb, Gd, Lu, Dy, Er, Yb or another suitable material. Following formation of the metal layer, the silicide layers 118 may be formed by annealing the device 10. Following the anneal, the silicide layers 118 may be or include one or more of NiSi, CoSi, MnSi, Wsi, FeSi, RhSi, PdSi, RuSi, PtSi, IrSi, OsSi, TiSi, CrSi, TaSi, MoSi, ZrSi, HfSi, ScSi, Ysi, HoSi, TbSI, GdSi, LuSi, DySi, ErSi, YbSi or the like. Silicide of the silicide layers 118 may diffuse into regions below the ESL 131. Thickness of the silicide layers 118 may be in a range of about 1 nm to about 10 nm. Below about 1 nm, contact resistance may be too high. Above about 10 nm, the silicide layers 118 may short with the channels 22B.

Following formation of the silicide layers 118, the source/drain contacts 120 are formed by filling the openings over the source/drain regions 82 with, for example, a liner layer and a fill layer. In some embodiments, the source/drain contacts 120 are formed by depositing a material that is or includes a conductive material such as Co, W, Ru, combinations thereof, or the like. In some embodiments, the source/drain contacts 120 are or include a Co-, W- or Ru-based compound or alloy including one or more elements, such as Zr, Sn, Ag, Cu, Au, Al, Ca, Be, Mg, Rh, Na, Ir, W, Mo, Zn, Ni, K, Co, Cd, Ru, In, Os, Si, Ge, Mn, combinations thereof, or the like. The source/drain contacts 120 land on the silicide layer 118 and are in contact with the ESL 131. Description of the device 10 and illustration thereof in many of the figures is given with reference to GAAFETs including vertical stacks of the nanostructures 22. In some embodiments, the silicide layers 118 and the source/drain contacts 120 are formed in and on source/drain regions 82 of FinFET devices.

Additional processing may be performed to finish fabrication of the nanostructure device 20P. For example, gate contacts (or gate vias) may be formed to electrically couple to the gate structures 200. An interconnect structure may then be formed over the source/drain contacts 120 and the gate contacts. The interconnect structure may include a plurality of dielectric layers (including, for example, a second ILD) surrounding metallic features, including conductive traces and conductive vias, which form electrical connection between devices on the substrate 110, such as the nanostructure devices 20, as well as to IC devices external to the IC device 10. In some embodiments, an additional interconnect structure may be formed on a backside of the nanostructure device 20P, and backside source/drain contacts and/or vias may be formed in the backside interconnect structure to make electrical contact with the source/drain regions 82P.

Embodiments may provide advantages. By covering OD patterns by the POBAR, epitaxial processing may not be performed in a transition area in which jog rounding is insufficient to prevent epitaxial defects. As such, because epitaxial processing is blocked in the transition area by the POBAR, epitaxial defects may be reduced or eliminated, which improves yield.

In accordance with at least one embodiment, a method includes: forming a first stack of semiconductor channels and a second stack of semiconductor channels over a substrate, the first stack of semiconductor channels being adjacent the second stack of semiconductor channels, a transition region overlapping neighboring protruding corners of the first stack and the second stack; forming a plurality of sacrificial gates over the first stack of semiconductor channels and the second stack of semiconductor channels, the plurality of sacrificial gates extending in a first direction and being arranged along a second direction transverse the first direction based on a first pitch along a second direction, each of the plurality of sacrificial gates having a first width; simultaneously with the forming a plurality of sacrificial gates, forming a bar structure over the transition region and adjacent to the plurality of sacrificial gates, the bar structure having a second width that exceeds a sum of the first pitch and the first width; forming a plurality of source/drain openings in areas of the first and second stacks of semiconductor channels that are exposed by the plurality of sacrificial gates and the bar structure; forming a plurality of source/drain regions in the plurality of source/drain openings; replacing the plurality of sacrificial gates with a plurality of gate structures that wrap around the semiconductor channels of the first and second stacks of semiconductor channels; simultaneously with replacing the plurality of sacrificial gates, replacing the bar structure with an inactive gate structure; and replacing the inactive gate structure with an isolation structure.

In accordance with at least one embodiment, a method includes: forming a first sacrificial gate structure having a first width; forming a second sacrificial gate structure having the first width and being offset from the first sacrificial gate structure by a pitch; forming a bar structure having a second width that exceeds a sum of the pitch and the first width, the bar structure being formed with the first and second sacrificial gate structures; forming a plurality of source/drain openings by recessing a stack of nanostructures underlying the first and second sacrificial gates and the bar structure, a transition region of the stack of nanostructures being protected by the bar structure during the forming a plurality of source/drain openings; and forming a plurality of source/drain regions in the plurality of source/drain openings.

In accordance with at least one embodiment, a device includes: a first stack of nanostructure channels having a first width along a first direction; a second stack of nanostructure channels having a second width along the first direction that exceeds the first width, the second stack of nanostructure channels being offset from the first stack of nanostructure channels along a second direction transverse the first direction; a first source/drain in contact with the first stack of nanostructure channels; a second source/drain in contact with the second stack of nanostructure channels; a first gate structure over and wrapping around the nanostructure channels of the first stack of nanostructure channels; a second gate structure over and wrapping around the nanostructure channels of the second stack of nanostructure channels; and an isolation structure that is between the first source/drain and the second source/drain, the isolation structure extending from a first level below the first and second stacks of nanostructure channels to a second level above the first and second stacks of nanostructure channels.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a first stack of semiconductor channels and a second stack of semiconductor channels over a substrate, the first stack of semiconductor channels being adjacent the second stack of semiconductor channels, a transition region overlapping neighboring protruding corners of the first stack of semiconductor channels and the second stack of semiconductor channels;

forming a plurality of sacrificial gates over the first stack of semiconductor channels and the second stack of semiconductor channels, the plurality of sacrificial gates extending in a first direction and being arranged along a second direction transverse the first direction based on a first pitch along a second direction, each of the plurality of sacrificial gates having a first width;

simultaneously with the forming a plurality of sacrificial gates, forming a bar structure over the transition region and adjacent to the plurality of sacrificial gates, the bar structure having a second width that exceeds a sum of the first pitch and the first width;

forming a plurality of source/drain openings in areas of the first and second stacks of semiconductor channels that are exposed by the plurality of sacrificial gates and the bar structure;

forming a plurality of source/drain regions in the plurality of source/drain openings;

replacing the plurality of sacrificial gates with a plurality of gate structures that wrap around the semiconductor channels of the first and second stacks of semiconductor channels;

simultaneously with replacing the plurality of sacrificial gates, replacing the bar structure with an inactive gate structure; and replacing the inactive gate structure with an isolation structure.

2. The method of claim 1, wherein the forming a bar structure includes forming the bar structure over a boundary between an N-type diffusion region and a P-type diffusion region, the boundary including rounding jog.

3. The method of claim 1, wherein the forming a bar structure includes forming the bar structure over a boundary between a first region of the substrate in which the first and second stacks of semiconductor channels include a first number of semiconductor channels and a second region of the substrate in which the first and second stacks of semiconductor channels include a second number of semiconductor channels, the first number exceeding the second number.

4. The method of claim 1, wherein the forming a bar structure includes forming the bar structure that partially covers the first and second stacks of semiconductor channels in the transition region while exposing at least a portion of the first and second stacks of semiconductor channels in the transition region.

5. The method of claim 1, wherein the forming a bar structure includes:

forming a first bar structure having a second width along the second direction; and forming a second bar structure adjoining the first bar structure, the second bar structure having a third width along the second direction that exceeds the second width.

6. The method of claim 5, wherein the forming a second bar structure includes forming the second bar structure having the second width that is at least a sum of two of the first pitch and one of the first width.

7. The method of claim 1, wherein the forming a bar structure includes forming the bar structure having the first width that is in a range of about 30 nanometers to about 90 nanometers.

8. A method, comprising:
   forming a first sacrificial gate structure having a first width;
   forming a second sacrificial gate structure having the first width and being offset from the first sacrificial gate structure by a pitch;
   forming a bar structure having a second width that exceeds a sum of the pitch and the first width, the bar structure being formed with the first and second sacrificial gate structures;
   forming a plurality of source/drain openings by recessing a stack of nanostructures underlying the first and second sacrificial gates and the bar structure, a transition region of the stack of nanostructures being protected by the bar structure during the forming a plurality of source/drain openings; and
   forming a plurality of source/drain regions in the plurality of source/drain openings.

9. The method of claim 8, further comprising:
   removing the bar structure;
   forming an opening in the transition region; and
   forming an isolation structure in the opening.

10. The method of claim 9, wherein the forming an isolation structure includes forming an isolation structure that extends from a level below the stack of nanostructures to a level above the stack of nanostructures.

11. The method of claim 9, wherein the forming an opening includes removing the stack of nanostructures in the transition region entirely.

12. The method of claim 9, wherein the forming an opening includes forming the opening at an outer portion of the stack of nanostructures in the transition region, the opening having width substantially equal to the first width.

13. The method of claim 10, wherein the forming an isolation structure includes forming the isolation structure that lands on an isolation region that is between the stack of nanostructures and another adjacent stack of nanostructures.

14. The method of claim 13, wherein the forming an isolation structure includes forming the isolation structure that has a portion that extends into a semiconductor fin to a level below that of an upper surface of the isolation region.

15. A method comprising:
   forming a first stack of nanostructure channels having a first width along a first direction;
   forming a second stack of nanostructure channels having a second width along the first direction that exceeds the first width,
   the second stack of nanostructure channels being offset from the first stack of nanostructure channels along a second direction transverse the first direction;
   forming a first source/drain in contact with the first stack of nanostructure channels;
   forming a second source/drain in contact with the second stack of nanostructure channels;
   forming a first gate structure over and wrapping around the nanostructure channels of the first stack of nanostructure channels;
   forming a second gate structure over and wrapping around the nanostructure channels of the second stack of nanostructure channels; and
   forming an isolation structure that is between the first source/drain and the second source/drain, the isolation structure extending from a first level below the first and second stacks of nanostructure channels to a second level above the first and second stacks of nanostructure channels.

16. The method of claim 15, wherein the isolation structure is separated from the first gate structure by a first distance and has width that exceeds the first distance.

17. The method of claim 16, wherein the isolation structure has width that exceeds twice the first distance.

18. The method of claim 15, wherein the isolation structure includes:
   a first isolation region;
   a second isolation region; and
   an inactive gate structure between the first and second isolation regions.

19. The method of claim 18, wherein the first isolation region includes:
   a first portion that extends into a fin underlying the first and second stacks of nanostructure channels; and
   a second portion that lands on a shallow trench isolation between the first stack of nanostructure channels and another stack of nanostructure channels offset from the first stack of nanostructure channels along the first direction.

20. The method of claim 15, wherein number of nanostructure channels in the first stack of nanostructure channels exceeds number of nanostructure channels in the second stack of nanostructure channels.

\* \* \* \* \*